US006985650B2

(12) United States Patent
Ma et al.

(10) Patent No.: US 6,985,650 B2
(45) Date of Patent: Jan. 10, 2006

(54) THERMAL ACTUATOR AND AN OPTICAL WAVEGUIDE SWITCH INCLUDING THE SAME

(75) Inventors: Jun Ma, Penfield, NY (US); Joel A. Kubby, Rochester, NY (US); Kristine A. German, Webster, NY (US); Peter M. Gulvin, Webster, NY (US); Pinyen Lin, Rochester, NY (US)

(73) Assignee: Xerox Corporation, Stamford, CT (US)

( * ) Notice: Subject to any disclaimer, the term of this patent is extended or adjusted under 35 U.S.C. 154(b) by 59 days.

(21) Appl. No.: 10/772,564

(22) Filed: Feb. 5, 2004

(65) Prior Publication Data

US 2005/0031252 A1 Feb. 10, 2005

Related U.S. Application Data

(63) Continuation-in-part of application No. 10/634,941, filed on Aug. 5, 2003.

(51) Int. Cl.
*G02B 6/26* (2006.01)
*G02B 6/42* (2006.01)
*H01H 37/00* (2006.01)

(52) U.S. Cl. ............................ 385/16; 385/14; 385/18; 385/19; 385/25; 385/40; 337/14; 337/123; 337/298; 337/305; 337/306; 337/382; 337/397

(58) Field of Classification Search ................ 385/4–5, 385/8–9, 14–19, 24–25, 27–28, 39–40, 52, 385/147, 50; 359/194, 223, 196; 310/307; 337/14, 123, 128, 135–136, 305–306, 382, 337/385, 391, 397

See application file for complete search history.

(56) References Cited

U.S. PATENT DOCUMENTS

| | | | | | |
|---|---|---|---|---|---|
| 5,364,497 | A | * | 11/1994 | Chau et al. | 216/39 |
| 5,706,041 | A | | 1/1998 | Kubby | 347/65 |
| 5,851,412 | A | | 12/1998 | Kubby | 216/27 |
| 5,862,003 | A | * | 1/1999 | Saif et al. | 359/871 |
| 5,870,518 | A | * | 2/1999 | Haake et al. | 385/90 |
| 5,909,078 | A | * | 6/1999 | Wood et al. | 310/307 |

(Continued)

FOREIGN PATENT DOCUMENTS

WO WO 01/99098 A2 * 12/2001

OTHER PUBLICATIONS

Yogesh B. Gianchandani and Khalil Najafi, “Bent-Beam Strain Sensors,” Journal of Microelectromechanical Systems, vol. 5, No. 1, Mar. 1996, pp. 52-58.

(Continued)

*Primary Examiner*—Frank G. Font
*Assistant Examiner*—Ryan Lepisto
(74) *Attorney, Agent, or Firm*—Wayne J. Egan

(57) ABSTRACT

A thermal actuator comprises a substantially straight beam. The beam has a beam length and a beam mid-point. The beam comprises a plurality of beam segments. Each beam segment has a beam segment width, the beam thus forming a corresponding plurality of beam segment widths. The beam segment widths vary along the beam length based on a predetermined pattern. As the beam is heated by an included heating means, the beam buckles. The buckling of the beam, in turn, causes the beam mid-point to translate or move in a predetermined direction. The beam mid-point movement, in turn, operates an included optical waveguide switch. The heating means comprises any of Joule heating, eddy current heating, conduction heating, convection heating and radiation heating.

120 Claims, 27 Drawing Sheets

U.S. PATENT DOCUMENTS

| | | | | |
|---|---|---|---|---|
| 5,955,817 | A * | 9/1999 | Dhuler et al. | 310/307 |
| 5,962,949 | A * | 10/1999 | Dhuler et al. | 310/307 |
| 5,994,816 | A * | 11/1999 | Dhuler et al. | 310/307 |
| 6,002,507 | A | 12/1999 | Floyd et al. | 359/201 |
| 6,014,240 | A | 1/2000 | Floyd et al. | 359/201 |
| 6,023,121 | A * | 2/2000 | Dhuler et al. | 310/307 |
| 6,114,794 | A * | 9/2000 | Dhuler et al. | 310/307 |
| 6,124,663 | A * | 9/2000 | Haake et al. | 310/307 |
| 6,133,670 | A * | 10/2000 | Rodgers et al. | 310/309 |
| 6,137,206 | A * | 10/2000 | Hill | 310/306 |
| 6,218,762 | B1 * | 4/2001 | Hill et al. | 310/307 |
| 6,236,139 | B1 * | 5/2001 | Hill et al. | 310/307 |
| 6,255,757 | B1 * | 7/2001 | Dhuler et al. | 310/307 |
| 6,262,512 | B1 * | 7/2001 | Mahadevan | 310/307 |
| 6,275,320 | B1 * | 8/2001 | Dhuler et al. | 359/237 |
| 6,291,922 | B1 * | 9/2001 | Dhuler | 310/307 |
| 6,303,885 | B1 * | 10/2001 | Hichwa et al. | 200/181 |
| 6,308,631 | B1 * | 10/2001 | Smith et al. | 102/254 |
| 6,324,748 | B1 * | 12/2001 | Dhuler et al. | 29/622 |
| 6,333,583 | B1 * | 12/2001 | Mahadevan et al. | 310/306 |
| 6,351,580 | B1 * | 2/2002 | Dhuler et al. | 385/19 |
| 6,360,539 | B1 * | 3/2002 | Hill et al. | 60/528 |
| 6,362,512 | B1 | 3/2002 | Kubby et al. | 257/415 |
| 6,367,251 | B1 * | 4/2002 | Wood | 60/528 |
| 6,379,989 | B1 | 4/2002 | Kubby et al. | 438/52 |
| 6,386,507 | B2 * | 5/2002 | Dhuler et al. | 251/11 |
| 6,388,359 | B1 * | 5/2002 | Duelli et al. | 310/309 |
| 6,422,011 | B1 * | 7/2002 | Sinclair | 60/528 |
| 6,428,173 | B1 * | 8/2002 | Dhuler et al. | 359/872 |
| 6,658,179 | B2 * | 12/2003 | Kubby et al. | 385/24 |
| 6,675,578 | B1 * | 1/2004 | Sinclair | 60/528 |
| 6,700,299 | B2 * | 3/2004 | Quenzer et al. | 310/311 |
| 6,708,492 | B2 * | 3/2004 | Sinclair | 60/527 |
| 6,734,597 | B1 * | 5/2004 | Howell et al. | 310/306 |
| 6,747,773 | B2 * | 6/2004 | Theil et al. | 359/237 |
| 6,753,582 | B2 * | 6/2004 | Ma | 257/415 |
| 6,754,243 | B2 * | 6/2004 | Missey et al. | 372/20 |
| 6,771,158 | B2 * | 8/2004 | Lee et al. | 337/36 |
| 6,804,959 | B2 * | 10/2004 | Sinclair | 60/527 |
| 6,828,887 | B2 * | 12/2004 | Kubby et al. | 335/78 |
| 6,853,765 | B1 * | 2/2005 | Cochran | 385/23 |
| 2002/0174891 | A1 * | 11/2002 | Maluf et al. | 137/14 |
| 2002/0190603 | A1 * | 12/2002 | Ma et al. | 310/309 |
| 2003/0029705 | A1 * | 2/2003 | Qiu et al. | 200/181 |
| 2003/0053231 | A1 * | 3/2003 | Missey et al. | 359/872 |
| 2003/0086641 | A1 * | 5/2003 | Kubby et al. | 385/24 |
| 2003/0121260 | A1 * | 7/2003 | Sinclair | 60/527 |
| 2003/0132822 | A1 * | 7/2003 | Ko et al. | 335/78 |
| 2003/0134445 | A1 | 7/2003 | Kubby | 438/31 |
| 2003/0210115 | A1 * | 11/2003 | Kubby et al. | 335/78 |
| 2004/0184709 | A1 * | 9/2004 | Kubby et al. | 385/16 |
| 2004/0184710 | A1 * | 9/2004 | Kubby et al. | 385/16 |
| 2004/0184720 | A1 * | 9/2004 | Kubby | 385/22 |
| 2004/0184760 | A1 * | 9/2004 | Kubby et al. | 385/147 |

OTHER PUBLICATIONS

Long Que, Jae-Sung Park and Yogesh B. Gianchandani, "Bent-Beam Electrothermal Actuators," Journal of Microelectromechanical Systems, vol. 10, No. 2, Jun. 2001, pp. 247-254.

John M. Maloney, Don L. DeVoe and David S. Schreiber, "Analysis and Design of Electrothermal Actuators Fabricated from Single Crystal Silicon," Proceedings ASME International Mechanical Engineering Conference and Exposition, Orlando, FL, pp. 233-240, 2000.

* cited by examiner

THERMAL ACTUATOR AND AN OPTICAL WAVEGUIDE SWITCH INCLUDING THE SAME

CROSS-REFERENCE TO RELATED APPLICATION

This is a continuation-in-part of its commonly-assigned "parent" prior application Ser. No. 10/634,941, filed 5 Aug. 2003, now pending, by Joel A. Kubby et al., the same inventors as in the present application, entitled "A thermal actuator and an optical waveguide switch including the same", the disclosure of which prior application is hereby incorporated by reference verbatim, with the same effect as though such disclosure were fully and completely set forth herein.

This application is related to the commonly-assigned application Ser. No. 10/772,693, filed on the same date as the present application, now pending, by Joel A. Kubby et al., the same inventors as in the present application, entitled "A thermal actuator with offset beam segment neutral axes and an optical waveguide switch including the same".

INCORPORATION BY REFERENCE OF OTHER PATENTS, PATENT APPLICATIONS AND PUBLICATIONS

The disclosures of the, following thirteen (13) U.S. patents are hereby incorporated by reference, verbatim, and with the same effect as though the same disclosures were fully and completely set forth herein:

Joel Kubby, U.S. Pat. No. 5,706,041, "Thermal ink-jet printhead with a suspended heating element in each ejector," issued Jan. 6, 1998;

Joel Kubby, U.S. Pat. No. 5,851,412, "Thermal ink-jet printhead with a suspended heating element in each ejector," issued Dec. 22, 1998;

Joel Kubby et al., U.S. Pat. No. 6,362,512, "Microelectromechanical structures defined from silicon on insulator wafers," issued Mar. 26, 2002;

Joel Kubby et al., U.S. Pat. No. 6,379,989, "Process for manufacture of microoptomechanical structures," issued Apr. 30, 2002;

Phillip D. Floyd et al., U.S. Pat. No. 6,002,507, "Method and apparatus for an integrated laser beam scanner," issued Dec. 14, 1999;

Phillip D. Floyd et al., U.S. Pat. No. 6,014,240, "Method and apparatus for an integrated laser beam scanner using a carrier substrate," issued Jan. 11, 2000;

Robert L. Wood et al., U.S. Pat. No. 5,909,078, "Thermal arched beam microelectromechanical actuators," issued Jun. 1, 1999;

Vijayakumar R. Dhuler et al., U.S. Pat. No. 5,994,816, "Thermal arched beam microelectromechanical devices and associated fabrication methods," issued Nov. 30, 1999;

Vijayakumar R. Dhuler et al., U.S. Pat. No. 6,023,121, "Thermal arched beam microelectromechanical structure," issued Feb. 8, 2000;

Vijayakumar R. Dhuler et al., U.S. Pat. No. 6,114,794, "Thermal arched beam microelectromechanical valve," issued Sep. 5, 2000;

Vijayakumar R. Dhuler et al., U.S. Pat. No. 6,255,757, "Microactuators including a metal layer on distal portions of an arched beam," issued Jul. 3, 2001;

Vijayakumar R. Dhuler et al., U.S. Pat. No. 6,324,748, "Method of fabricating a microelectro mechanical structure having an arched beam," issued Dec. 4, 2001; and Edward A. Hill et al., U.S. Pat. No. 6,360,539, "Microelectromechanical actuators including driven arched beams for mechanical advantage," issued Mar. 26, 2002.

The disclosures of the following four (4) U.S. patent applications are hereby incorporated by reference, verbatim, and with the same effect as though the same disclosures were fully and completely set forth herein:

Joel Kubby, U.S. patent application Ser. No. 09/683,533, "Systems and methods for thermal isolation of a silicon structure," filed Jan. 16, 2002, now U.S. Patent Application Publication No. 20030134445, published Jul. 17, 2003;

Joel Kubby, U.S. Pat. Application No. 60/456,086, "MxN Cantilever Beam Optical-Waveguide Switch," filed Mar. 19, 2003;

Joel Kubby et al., U.S. patent application Ser. No. 09/986, 395, "Monolithic reconfigurable optical multiplexer systems and methods," filed Nov. 8, 2001, now U.S. Patent Application Publication No. 20030086641, published May 8, 2003; and Joel Kubby et al., U.S. Pat. Application No. 60/456,063, "MEMS Optical Latching Switch," filed Mar. 19, 2003.

The disclosures of the following three (3) publications are hereby incorporated by reference, verbatim, and with the same effect as though the same disclosures were fully and completely set forth herein:

Yogesh B. Gianchandani and Khalil Najafi, "Bent-Beam Strain Sensors," Journal of Microelectromechanical Systems, Vol. 5, No.1, March 1996, pages 52–58;

Long Que, Jae-Sung Park and Yogesh B. Gianchandani, "Bent-Beam Electrothermal Actuators," Journal of Microelectromechanical Systems, Vol. 10, No. 2, June 2001, pages 247–254; and John M. Maloney, Don L. DeVoe and David S. Schreiber, "Analysis and Design of Electrothermal Actuators Fabricated from Single Crystal Silicon," Proceedings ASME International Mechanical Engineering Conference and Exposition, Orlando, Fla., pages 233–240, 2000.

FIELD OF THE INVENTION

This application relates generally to thermal actuators and more particularly to a thermal actuator that is suitable for use in an optical waveguide switch.

BACKGROUND OF THE INVENTION

The traditional thermal actuator, the "V-beam" actuator, is widely used in microelectromechanical or "MEMS" structures. Such actuators are described in U.S. Pat. No. 5,909,078 to Robert L. Wood et al.; and in the U.S. Patents to Vijayakumar R. Dhuler et al., U.S. Pat. No. 5,994,816, No. 6,023,121, No. 6,114,794, No. 6,255,757 and No. 6,324,748; and in U.S. Pat. No. 6,360,539 to Edward A. Hill et al., all of the foregoing patents being incorporated by reference herein; and in the publication of Long Que, Jae-Sung Park and Yogesh B. Gianchandani, "Bent-Beam Electrothermal Actuators"; and in the publication of John M. Maloney, Don L. DeVoe and David S. Schreiber, "Analysis and Design of Electrothermal Actuators Fabricated from Single Crystal Silicon," both of which publications are incorporated by reference herein.

However, these actuators are sensitive to residual stresses, especially the stress introduced by doping during fabrication of the actuator.

Indeed, the bent-beam geometry used in these actuators has been used in bent-beam strain sensors to measure residual stress as described in the publication of Yogesh B.

Gianchandani and Khalil Najafi, “Bent-Beam Strain Sensors,” which publication is incorporated by reference herein.

The residual stress in the V-beam actuator acts to deflect the V-beams away from their originally-designed target locations since the beam angle gives rise to a transverse force. Moreover, when such a V-beam actuator is used in an optical waveguide switch, this residual stress results in waveguide misalignment. The amount of optical loss caused by this waveguide misalignment is substantial. As a result, currently the V-beam actuator is generally unacceptable for use in an optical waveguide switch.

Thus, there is a need for an actuator that is acceptable for use in an optical waveguide switch.

SUMMARY OF THE INVENTION

In a first aspect of the invention, a thermal actuator comprises a substrate having a surface; a first support and a second support disposed on the surface and extending orthogonally therefrom; a beam extending between the first support and the second support, the beam having a first side, a second side, a beam length and a beam mid-point, the beam being substantially straight along the first side; the beam comprised of a plurality of beam segments, each beam segment of the plurality of beam segments having a beam segment width orthogonal to the beam length, the beam thus forming a corresponding plurality of beam segment widths; wherein the plurality of beam segment widths corresponding to the beam vary along the beam length based on a predetermined pattern; so that a heating of the beam causes a beam buckling and the beam mid-point to translate in a predetermined direction generally normal to and outward from the second side.

In a second aspect of the invention, a thermal actuator comprises a substrate having a surface; a first support and a second support disposed on the surface and extending orthogonally therefrom; a plurality of beams extending in parallel between the first support and the second support, thus forming a beam array; each beam of the beam array having a first side, a second side, a beam length and a beam mid-point, each beam being substantially straight along its first side; each beam of the beam array comprised of a plurality of beam segments, each beam segment of the plurality of beam segments having a beam segment width orthogonal to the beam length, each beam thus forming a corresponding plurality of beam segment widths; wherein the plurality of beam segment widths corresponding to each beam vary along the beam length based on a predetermined pattern; an included coupling beam extending orthogonally across the beam array to couple each beam of the beam array substantially at the corresponding beam mid-point; so that a heating of the beam array causes a beam array buckling and the coupling beam to translate in a predetermined direction generally normal to and outward from the second sides of the array beams.

In a third aspect of the invention, a thermal actuator comprises a substrate having a surface; a first support and a second support disposed on the surface and extending orthogonally therefrom; a beam extending between the first support and the second support, the beam having a first side, a second side, a beam length and a beam mid-point, the beam being substantially straight along the second side; the beam comprised of a plurality of beam segments, each beam segment of the plurality of beam segments being having a beam segment width orthogonal to the beam length, the beam thus forming a corresponding plurality of beam segment widths; wherein the plurality of beam segment widths corresponding to the beam vary along the beam length based on a predetermined pattern; so that a heating of the beam causes a beam buckling and the beam mid-point to translate in a predetermined direction generally normal to and outward from the second side.

In a fourth aspect of the invention, a thermal actuator comprises a substrate having a surface; a first support and a second support disposed on the surface and extending orthogonally therefrom; a plurality of beams extending in parallel between the first support and the second support, thus forming a beam array; each beam of the beam array having a first side, a second side, a beam length and a beam mid-point, each beam being substantially straight along its second side; each beam of the beam array comprised of a plurality of beam segments, each beam segment of the plurality of beam segments having a beam segment width orthogonal to the beam length, each beam thus forming a corresponding plurality of beam segment widths; wherein the plurality of beam segment widths corresponding to each beam vary along the beam length based on a predetermined pattern; an included coupling beam extending orthogonally across the beam array to couple each beam of the beam array substantially at the corresponding beam mid-point; so that a heating of the beam array causes a beam array buckling and the coupling beam to translate in a predetermined direction generally normal to and outward from the second sides of the array beams.

In a fifth aspect of the invention, a thermal actuator comprises a substrate having a surface; a first support and a second support disposed on the surface and extending orthogonally therefrom; a beam extending between the first support and the second support, the beam having a first side, a second side, a beam length and a beam mid-point, the beam being substantially straight along the first side; the beam comprised of a plurality of beam segments, each beam segment of the plurality of beam segments having a beam segment average width orthogonal to the beam length, the beam thus forming a corresponding plurality of beam segment average widths; wherein the plurality of beam segment average widths corresponding to the beam vary along the beam length based on a predetermined pattern; so that a heating of the beam causes a beam buckling and the beam mid-point to translate in a predetermined direction generally normal to and outward from the second side.

In a sixth aspect of the invention, a thermal actuator comprises a substrate having a surface; a first support and a second support disposed on the surface and extending orthogonally therefrom; a plurality of beams extending in parallel between the first support and the second support, thus forming a beam array; each beam of the beam array having a first side, a second side, a beam length and a beam mid-point, each beam being substantially straight along its first side; each beam of the beam array comprised of a plurality of beam segments, each beam segment of the plurality of beam segments having a beam segment average width orthogonal to the beam length, each beam thus forming a corresponding plurality of beam segment average widths; wherein the plurality of beam segment average widths corresponding to each beam vary along the beam length based on a predetermined pattern; an included coupling beam extending orthogonally across the beam array to couple each beam of the beam array substantially at the corresponding beam mid-point; so that a heating of the beam array causes a beam array buckling and the coupling beam to translate in a predetermined direction generally normal to and outward from the second sides of the array beams.

In a seventh aspect of the invention, an optical waveguide switch comprises a thermal actuator, the thermal actuator comprising a substrate having a surface; a first support and a second support disposed on the surface and extending orthogonally therefrom; a beam extending between the first support and the second support, the beam having a first side, a second side, a beam length and a beam mid-point, the beam being substantially straight along the first side; the beam comprised of a plurality of beam segments, each beam segment of the plurality of beam segments having a beam segment width orthogonal to the beam length, the beam thus forming a corresponding plurality of beam segment widths; wherein the plurality of beam segment widths corresponding to the beam vary along the beam length based on a predetermined pattern; so that a heating of the beam causes a beam buckling and the beam mid-point to translate in a predetermined direction generally normal to and outward from the second side.

In an eighth aspect of the invention, an optical waveguide switch comprises a thermal actuator, the thermal actuator comprising a substrate having a surface; a first support and a second support disposed on the surface and extending orthogonally therefrom; a plurality of beams extending in parallel between the first support and the second support, thus forming a beam array; each beam of the beam array having a first side, a second side, a beam length and a beam mid-point, each beam being substantially straight along its first side; each beam of the beam array comprised of a plurality of beam segments, each beam segment of the plurality of beam segments having a beam segment width orthogonal to the beam length, each beam thus forming a corresponding plurality of beam segment widths; wherein the plurality of beam segment widths corresponding to each beam vary along the beam length based on a predetermined pattern; an included coupling beam extending orthogonally across the beam array to couple each beam of the beam array substantially at the corresponding beam mid-point; so that a heating of the beam array causes a beam array buckling and the coupling beam to translate in a predetermined direction generally normal to and outward from the second sides of the array beams.

In a ninth aspect of the invention, an optical waveguide switch comprises a thermal actuator, the thermal actuator comprising a substrate having a surface; a first support and a second support disposed on the surface and extending orthogonally therefrom; a beam extending between the first support and the second support, the beam having a first side, a second side, a beam length and a beam mid-point, the beam being substantially straight along the second side; the beam comprised of a plurality of beam segments, each beam segment of the plurality of beam segments being having a beam segment width orthogonal to the beam length, the beam thus forming a corresponding plurality of beam segment widths; wherein the plurality of beam segment widths corresponding to the beam vary along the beam length based on a predetermined pattern; so that a heating of the beam causes a beam buckling and the beam mid-point to translate in a predetermined direction generally normal to and outward from the second side.

In a tenth aspect of the invention, an optical waveguide switch comprises a thermal actuator, the thermal actuator comprising a substrate having a surface; a first support and a second support disposed on the surface and extending orthogonally therefrom; a plurality of beams extending in parallel between the first support and the second support, thus forming a beam array; each beam of the beam array having a first side, a second side, a beam length and a beam mid-point, each beam being substantially straight along its second side; each beam of the beam array comprised of a plurality of beam segments, each beam segment of the plurality of beam segments having a beam segment width orthogonal to the beam length, each beam thus forming a corresponding plurality of beam segment widths; wherein the plurality of beam segment widths corresponding to each beam vary along the beam length based on a predetermined pattern; an included coupling beam extending orthogonally across the beam array to couple each beam of the beam array substantially at the corresponding beam mid-point; so that a heating of the beam array causes a beam array buckling and the coupling beam to translate in a predetermined direction generally normal to and outward from the second sides of the array beams.

In an eleventh aspect of the invention, an optical waveguide switch comprises a thermal actuator, the thermal actuator comprising a substrate having a surface; a first support and a second support disposed on the surface and extending orthogonally therefrom; a beam extending between the first support and the second support, the beam having a first side, a second side, a beam length and a beam mid-point, the beam being substantially straight along the first side; the beam comprised of a plurality of beam segments, each beam segment of the plurality of beam segments having a beam segment average width orthogonal to the beam length, the beam thus forming a corresponding plurality of beam segment average widths; wherein the plurality of beam segment average widths corresponding to the beam vary along the beam length based on a predetermined pattern; so that a heating of the beam causes a beam buckling and the beam mid-point to translate in a predetermined direction generally normal to and outward from the second side.

In a twelfth aspect of the invention, an optical waveguide switch comprises a thermal actuator, the thermal actuator comprising a substrate having a surface; a first support and a second support disposed on the surface and extending orthogonally therefrom; a plurality of beams extending in parallel between the first support and the second support, thus forming a beam array; each beam of the beam array having a first side, a second side, a beam length and a beam mid-point, each beam being substantially straight along its first side; each beam of the beam array comprised of a plurality of beam segments, each beam segment of the plurality of beam segments having a beam segment average width orthogonal to the beam length, each beam thus forming a corresponding plurality of beam segment average widths; wherein the plurality of beam segment average widths corresponding to each beam vary along the beam length based on a predetermined pattern; an included coupling beam extending orthogonally across the beam array to couple each beam of the beam array substantially at the corresponding beam mid-point; so that a heating of the beam array causes a beam array buckling and the coupling beam to translate in a predetermined direction generally normal to and outward from the second sides of the array beams.

BRIEF DESCRIPTION OF THE SEVERAL VIEWS OF THE DRAWING

FIG. 4 is an elevated top-down "birds-eye" view of the thermal actuator 200, including a first reference line 5 and a second reference line 6.

FIG. 5 is a first "cut-away" side or profile view of the thermal actuator 200 along the FIG. 4 first reference line 5.

FIG. 6 is a second "cut-away" side or profile view of the thermal actuator 200 along the FIG. 4 second reference line 6.

FIG. 7 is an elevated top-down "birds-eye" view of the thermal actuator 300, including a first reference line 8 and a second reference line 9.

FIG. 8 is a first "cut-away" side or profile view of the thermal actuator 300 along the FIG. 7 first reference line 8.

FIG. 9 is a second "cut-away" side or profile view of the thermal actuator 300 along the FIG. 7 second reference line 9.

FIG. 10 is an elevated top-down "birds-eye" view of the thermal actuator 400, including a first reference line 11 and a second reference line 12.

FIG. 11 is a first "cut-away" side or profile view of the thermal actuator 400 along the FIG. 10 first reference line 11.

FIG. 12 is a second "cut-away" side or profile view of the thermal actuator 400 along the FIG. 10 second reference line 12.

DETAILED DESCRIPTION OF THE INVENTION

Figure 1:
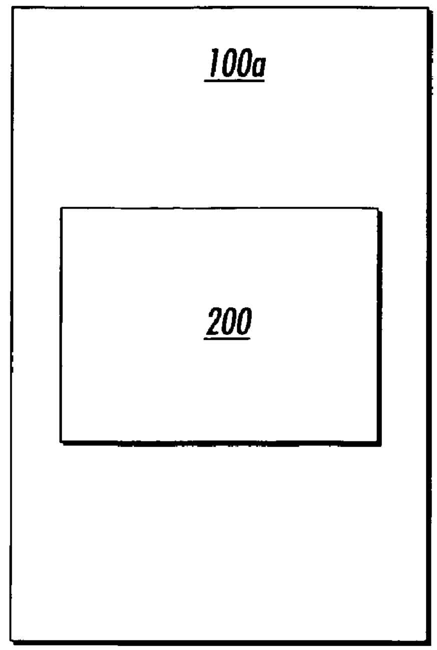
FIG. 1 is a block diagram of an optical waveguide switch 100*a* comprising a first embodiment 200 of a thermal actuator.

Referring now to the optical waveguide switches 100*a*, 100*b*, 100*c* and their corresponding thermal actuators 200, 300, 400 described below in connection with FIGS. 1–12, in brief, a thermal actuator 200, 300 or 400 comprises a plurality of substantially straight and parallel beams arranged to form a beam array. The mid-point of each beam is attached or coupled to an orthogonal coupling beam. Each array beam has a beam heating parameter with a corresponding beam heating parameter value. The beam heating parameter values vary across the beam array based on a predetermined pattern. As the beams are heated by an included heating means, the distribution of beam temperatures in the beam array becomes asymmetric, thus causing the beam array to buckle. The buckling of the beams in the beam array, in turn, causes the attached coupling beam to translate or move in a predetermined direction. The coupling beam movement, in turn, operates an included optical waveguide switch 100*a*, 100*b* or 100*c*. The beams in the beam array are heated by any of Joule heating, eddy current heating, conduction heating, convection heating and radiation heating.

Referring now to the optical waveguide switches 100*d* and 100*f* and their corresponding thermal actuators 500 and 700 described below in connection with FIGS. 13, 15, 19–24 and 31–36, in brief, a thermal actuator 500 or 700 comprises a substantially straight beam 510 or 710. The beam has a beam length 518 or 718 and a beam mid-point 519 or 719. The beam comprises a plurality of beam segments 520, 522, 524 or 720, 722, 724 with corresponding beam segment widths 525, 526, 527 or 725, 726, 727. The beam segment widths vary along the beam length based on a predetermined pattern. As the beam is heated by an included heating means, the beam buckles. The buckling of the beam, in turn, causes the beam mid-point to translate or move in a predetermined direction 548 or 748. The beam mid-point movement, in turn, operates an included optical waveguide switch 100*d* or 100*f*. The heating means comprises any of Joule heating, eddy current heating, conduction heating, convection heating and radiation heating.

Referring now to the optical waveguide switches 100*e* and 100*g* and their corresponding thermal actuators 600 and 800 described below in connection with FIGS. 14, 16, 25–30 and 37–42, in brief, a thermal actuator 600 or 800 comprises a plurality of beams 610*a*, 610*b*, 610*c* or 810*a*, 810*b*, 810*c*, each beam substantially similar to the beam 510 or 710 described above, the plurality of beams arranged to form a beam array 613 or 813. The mid-point of each beam is attached or coupled to an orthogonal coupling beam 614 or 814. As the plurality of beams are heated by an included heating means, the beam array buckles. The buckling of the beams in the beam array, in turn, causes the attached coupling beam to more in a predetermined direction 648 or 848. The coupling beam movement, in turn, operates an included optical waveguide switch 100*e* or 100*g*. The heating means comprises any of Joule heating, eddy current heating, conduction heating, convection heating and radiation heating.

Referring now to the optical waveguide switch 100*h* and its corresponding thermal actuator 900 described below in connection with FIGS. 17 and 43–48, in brief, a thermal actuator 900 comprises a substantially straight beam 910. The beam has a beam length 918 and a beam mid-point 919. The beam comprises a plurality of beam segments 920, 921, 922, 923, 924 with beam segment lengths. Each beam segment has a beam segment average width, thus forming a corresponding plurality of beam segment average widths 925, 931, 926, 933, 927. The beam segment average widths vary along the beam length based on a predetermined pattern. As the beam is heated by an included heating means, the beam buckles. The buckling of the beam, in turn, causes the beam mid-point to translate or move in a predetermined direction 948. The beam mid-point movement, in turn, operates an included optical waveguide switch 100*h*. The heating means comprises any of Joule heating, eddy current heating, conduction heating, convection heating and radiation heating.

Referring now to the optical waveguide switch 100*i* and its corresponding thermal actuator 1000 described below in connection with FIGS. 18 and 49–54, in brief, a thermal actuator 1000 comprises a plurality of beams 1010*a*, 1010*b*, 1010*c*, the plurality of beams arranged to form a beam array 1009. Each beam comprises a plurality of beam segments 1020, 1021, 1022, 1023, 1024. Each beam segment has a beam segment average width, the plurality of beams thus forming a corresponding plurality of beam segment average widths 1025*a*, 1031*a*, 1026*a*, 1033*a*, 1027*a*; 1025*b*, 1031*b*, 1026*b*, 1033*b*, 1027*b*; 1025*c*, 1031*c*, 1026*c*, 1033*c*, 1027*c*. The plurality of beam segment average widths corresponding to each beam vary along the beam length based on a predetermined pattern. The mid-point 1019 of each beam is attached or coupled to an orthogonal coupling beam 1005. As the plurality of beams are heated by an included heating means, the beam array buckles. The buckling of the beams in the beam array, in turn, causes the attached coupling beam to more in a predetermined direction 1048. The coupling beam movement, in turn, operates an included optical waveguide switch 100*i*. The heating means comprises any of Joule heating, eddy current heating, conduction heating, convection heating and radiation heating.

Referring now to FIG. 1, there is shown a block diagram of an optical waveguide switch 100*a* comprising a first embodiment 200 of a thermal actuator. The thermal actuator 200 is described in greater detail in connection with FIGS. 4–6 below.

Figure 2:
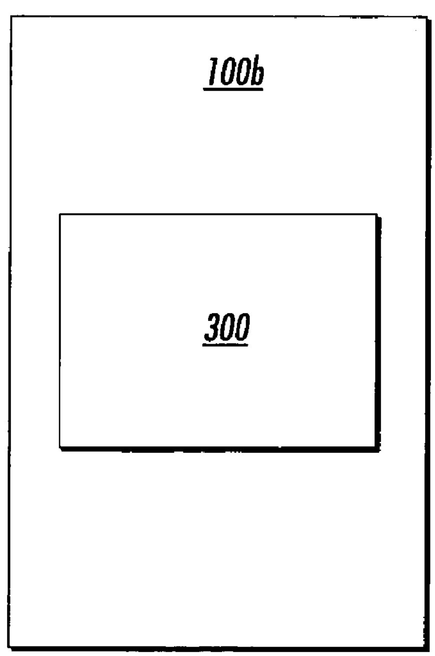
FIG. 2 is a block diagram of an optical waveguide switch 100*b* comprising a second embodiment 300 of thermal actuator.

Referring now to FIG. 2, there is shown a block diagram of an optical waveguide switch 100*b* comprising a second embodiment 300 of thermal actuator. The thermal actuator 300 is described in greater detail in connection with FIGS. 7–9 below.

Figure 3:
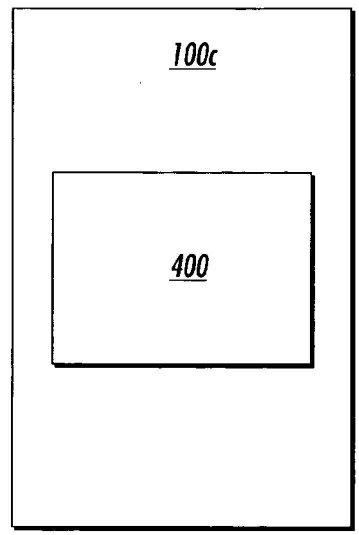
FIG. 3 is a block diagram of an optical waveguide switch 100_c_ comprising a third embodiment 400 of a thermal actuator.

Referring now to FIG. 3, there is shown a block diagram of an optical waveguide switch 100*c* comprising a third embodiment 400 of a thermal actuator. The thermal actuator 400 is described in greater detail in connection with FIGS. 10–12 below.

Examples of optical waveguide switches that incorporate thermal actuators have been described in the application of Joel Kubby, U.S. Pat. Application No. 60/456,086, filed Mar. 19, 2003; and in the applications of Joel Kubby et al., U.S. patent application Ser. No. 09/986,395, filed Nov. 8, 2001, now U.S. patent application Publication No. 20030086641, published May 8, 2003; and U.S. Pat. Application No. 60/456,063, filed Mar. 19, 2003, all of the foregoing patent applications being incorporated by reference herein.

Figure 4:
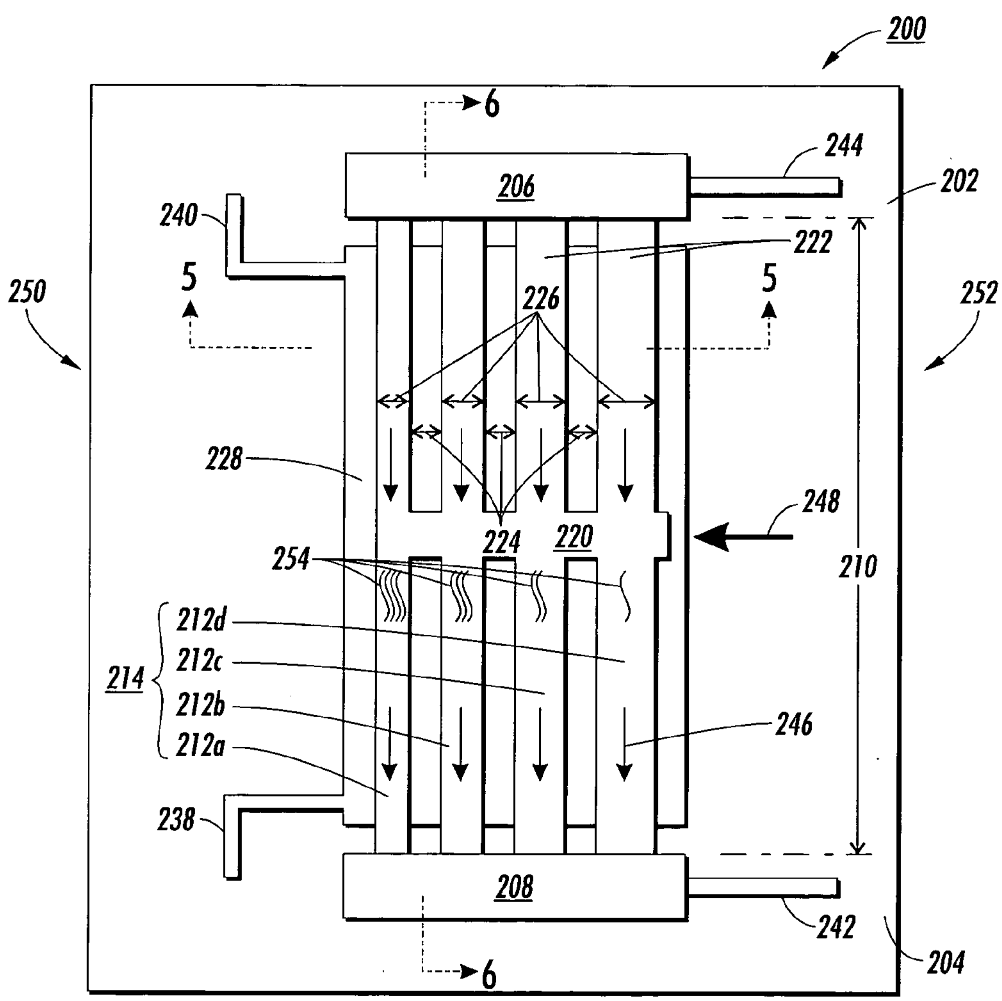
FIGS. 4–6 depict the first embodiment 200 of the thermal actuator as follows.
Figure 5:
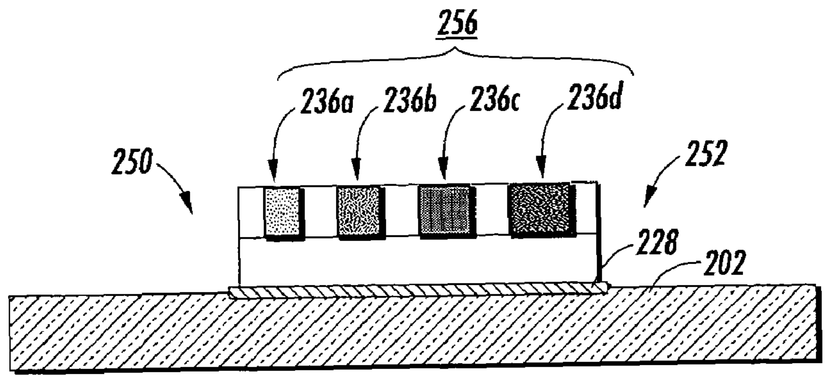
Figure 6:
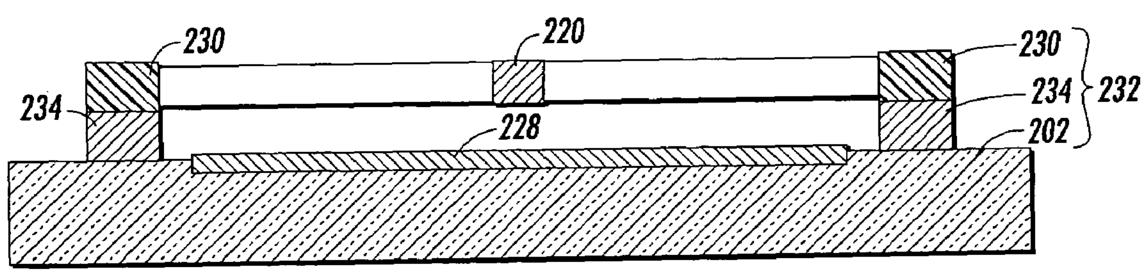

FIGS. 4–6 depict the thermal actuator 200 in greater detail.

Referring now to FIG. 4, there is shown an elevated top-down "birds-eye" view of the thermal actuator 200, including a first reference line 5 and a second reference line 6. As shown, the thermal actuator 200 comprises a substrate 202 having a surface 204; a first support 206 and a second support 208 disposed on the surface and extending orthogonally therefrom, a plurality of beams 212*a*–212*d* extending in parallel between the first support and the second support, thus forming a beam array 214, each beam being agonic and substantially straight; each beam of the beam array having a beam width 226 with a corresponding beam width value, the beams in the beam array having beam width values that vary based on a predetermined pattern; and an included coupling beam 220 extending orthogonally across the beam array to couple each array beam substantially at its mid-point.

The predetermined pattern is characterized in that, across the beam array 214 from one side 250 of the beam array to the opposite side 252 of the beam array, successive beam width values do not decrease and at least sometimes increase.

Each pair 222 of adjacent beams in the beam array 214 has a beam spacing 224 with a corresponding beam spacing value, with all such pairs of adjacent beams in the beam array having substantially the same beam spacing value.

As shown in FIG. 4, with cross-reference to FIGS. 5–6, in one embodiment, the thermal actuator 200 includes a heater layer 228 disposed on the surface facing the plurality of beams and arranged to heat the plurality of beams. The heater layer is coupled to a heater layer input 238 and a heater layer output 240 and arranged to cause or form a heating of the plurality of beams.

The heater layer 228 can be thermally isolated from the substrate as described in U.S. Pat. No. 5,706,041 and No. 5,851,412 to Joel Kubby, both of which patents are incorporated by reference herein.

Further, in one embodiment, each beam of the plurality of beams is arranged to be heated by a beam heater current 246 supplied by an included beam input 242 and beam output 244, thus resulting in a heating of the plurality of beams.

The plurality of beams can be thermally isolated from the substrate as described in the application of Joel Kubby, U.S. patent application Ser. No. 09/683,533, filed Jan. 16, 2002, now U.S. Patent Application Publication No. 20030134445, published Jul. 17, 2003, which patent application is incorporated by reference herein.

As shown, the plurality of beams is arranged so that the heating of the plurality of beams causes a beam buckling and the coupling beam to translate in a predetermined direction 248. In one embodiment, the heating of the plurality of beams is supplied by the heater layer 228. In another embodiment, the heating of the plurality of beams is supplied by the beam heater current 246. In still another embodiment, the heating of the plurality of beams is supplied by a combination of the heater layer 228 and the beam heater current 246.

Referring generally to FIGS. 4–6, in one embodiment, each beam of the plurality of beams is fabricated of a low-conductivity material of either monocrystalline silicon or polycrystalline silicon.

In one embodiment, each beam of the plurality of beams is fabricated in a device layer 230 of a silicon-on-insulator wafer 232.

A method for fabricating the plurality of beams in a device layer of a silicon-on-insulator wafer is described in the U.S. Patents to Phillip D. Floyd et al., U.S. Pat. No. 6,002,507 and No. 6,014,240; and in the U.S. Patents to Joel Kubby et al., U.S. Pat. No. 6,362,512 and No. 6,379,989, all of the foregoing patents being incorporated by reference herein.

In one embodiment, the first support 206 and second support 208 are fabricated in a buried oxide layer 234 of a silicon-on-insulator wafer 232.

Figure 7:
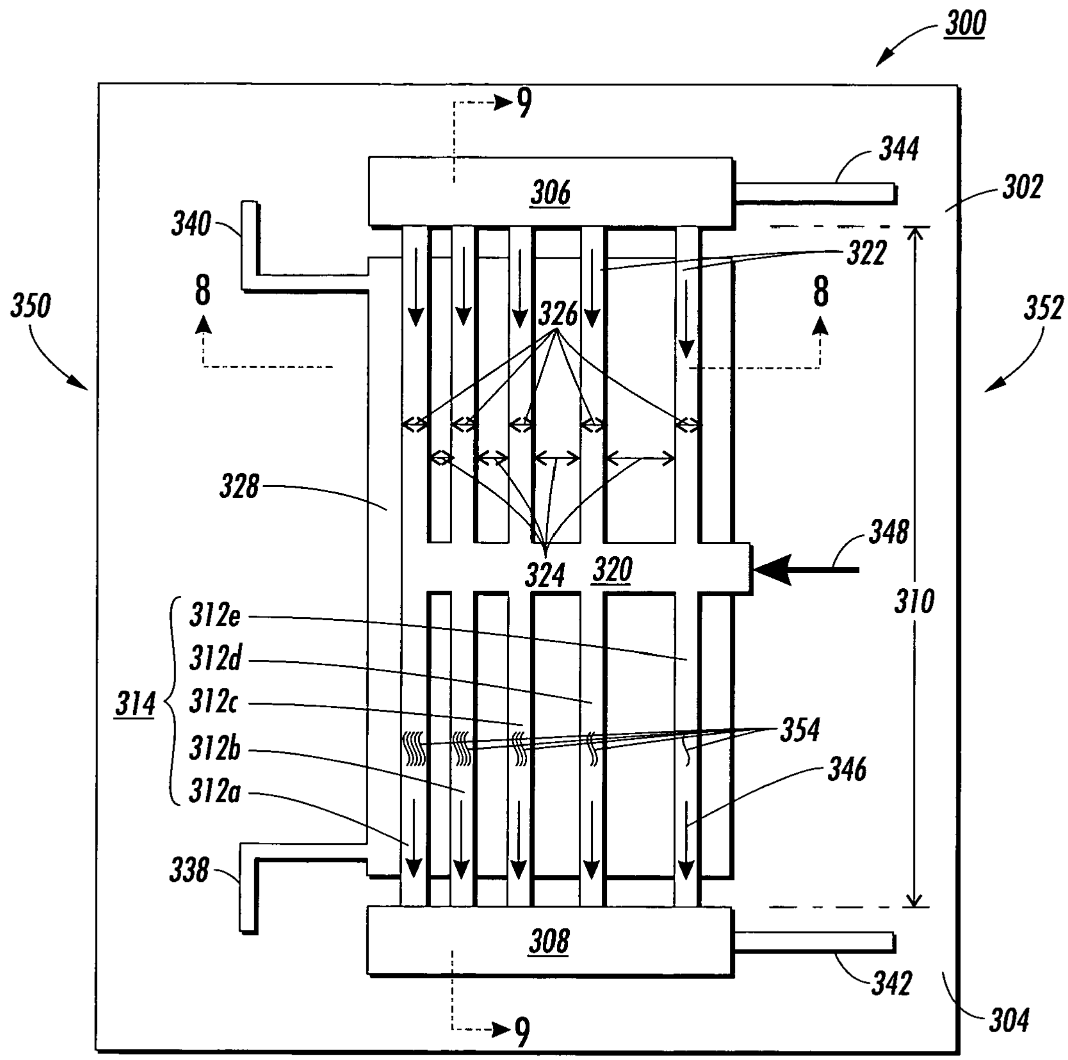
FIGS. 7–9 depict the second embodiment 300 of the thermal actuator as follows.
Figure 8:
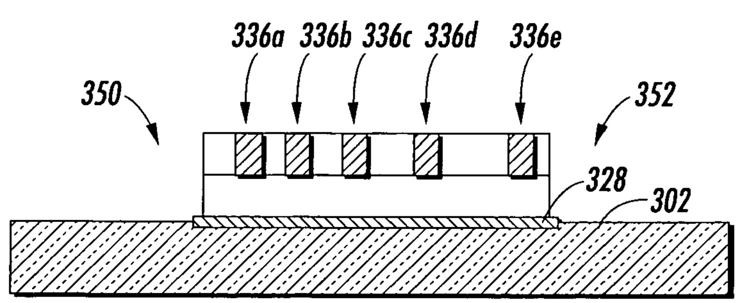
Figure 9:
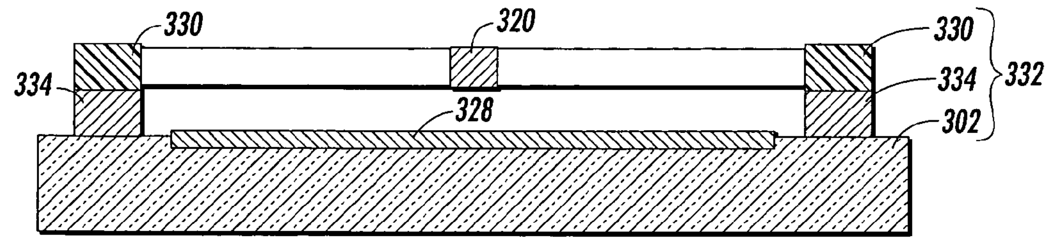

FIGS. 7–9 depict the thermal actuator 300 in greater detail.

Referring now to FIG. 7, there is shown an elevated top-down "birds-eye" view of the thermal actuator 300, including a first reference line 8 and a second reference line 9. As shown, the thermal actuator 300 comprises a substrate 302 having a surface 304; a first support 306 and a second support 308 disposed on the surface and extending orthogonally therefrom, a plurality of beams extending in parallel between the first support and the second support, thus forming a beam array 314, each beam being agonic and substantially straight; each pair 322 of adjacent beams in the beam array defining a beam spacing with a corresponding beam spacing value, the pairs of adjacent beams in the beam array having beam spacing values that vary based on a predetermined pattern; and an included coupling beam 320 extending orthogonally across the beam array to couple each array beam substantially at its mid-point.

The predetermined pattern is characterized in that, across the beam array 314 from one side 350 of the beam array to the opposite side 352 of the beam array, successive beam spacing values do not decrease and at least sometimes increase.

Each beam of the beam array 314 has a beam width 326 with a corresponding beam width value, with all beams of the beam array having substantially the same beam width value.

As shown in FIG. 7, with cross-reference to FIGS. 8–9, in one embodiment, the thermal actuator 300 includes a heater layer 328 disposed on the surface facing the plurality of beams and arranged to heat the plurality of beams. The heater layer is coupled to a heater layer input 338 and a heater layer output 340, and is arranged to cause or form a heating of the plurality of beams.

Further, in one embodiment, each beam of the plurality of beams is arranged to be heated by a beam heater current 346 supplied by an included beam input 342 and beam output 344, thus resulting in a heating of the plurality of beams.

As shown, the plurality of beams is arranged so that the heating of the plurality of beams causes a beam buckling and the coupling beam to translate in a predetermined direction 348. In one embodiment, the heating of the plurality of beams is supplied by the heater layer 328. In another embodiment, the heating of the plurality of beams is supplied by the beam heater current 346. In still another embodiment, the heating of the plurality of beams is supplied by a combination of the heater layer 328 and the beam heater current 346.

Referring generally to FIGS. 7–9, in one embodiment, each beam of the plurality of beams is fabricated of a low-conductivity material of either monocrystalline silicon or polycrystalline silicon.

In one embodiment, each beam of the plurality of beams is fabricated in a device layer 330 of a silicon-on-insulator wafer 332.

In one embodiment, the first support 306 and the second support 308 are fabricated in a buried oxide layer 334 of a silicon-on-insulator wafer 332.

Figure 10:
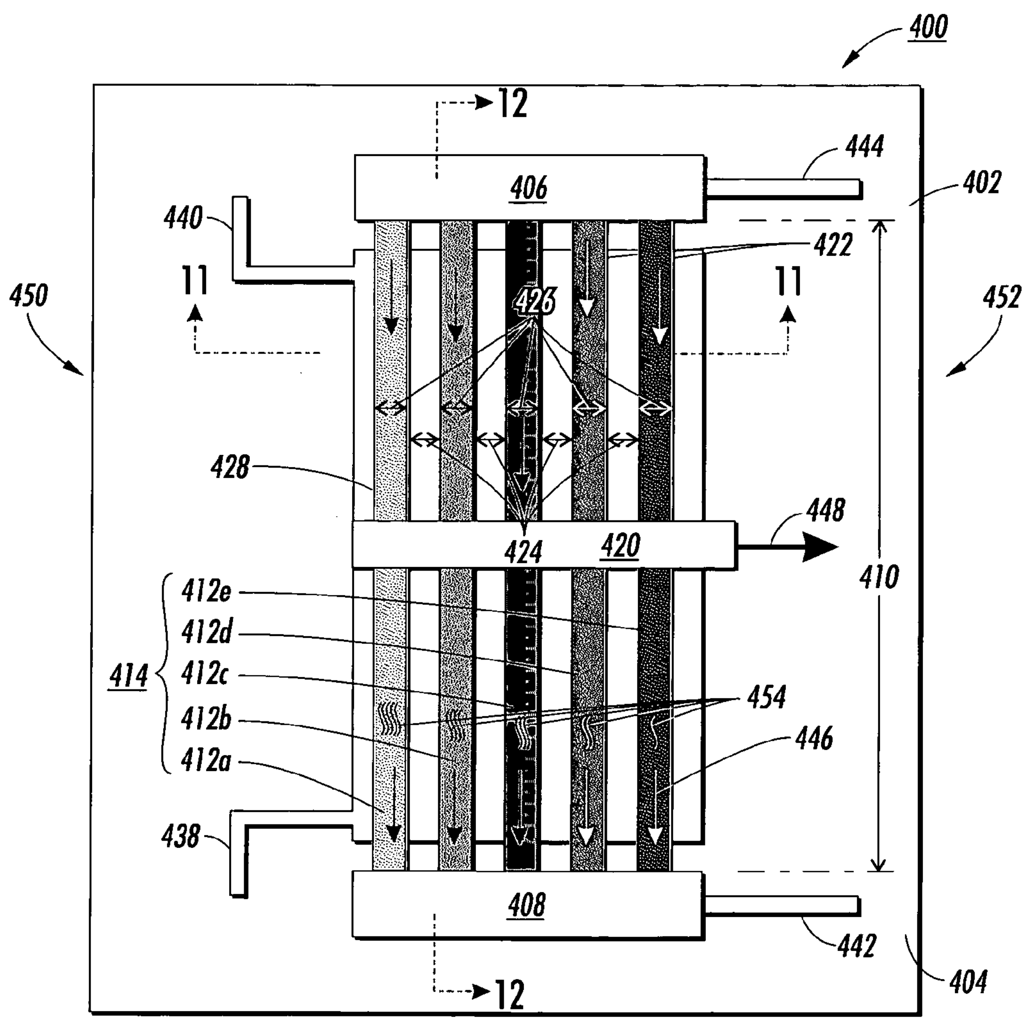
FIGS. 10–12 depict the third embodiment 400 of the thermal actuator as follows.
Figure 11:
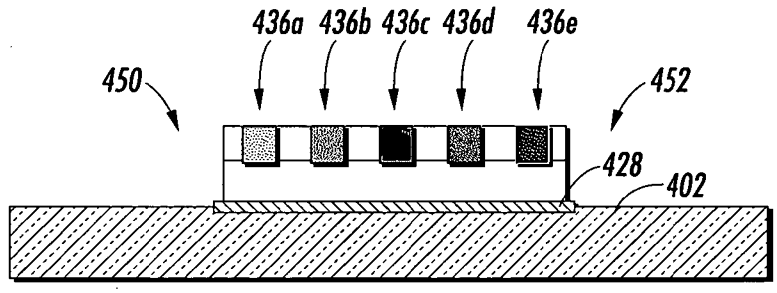
Figure 12:
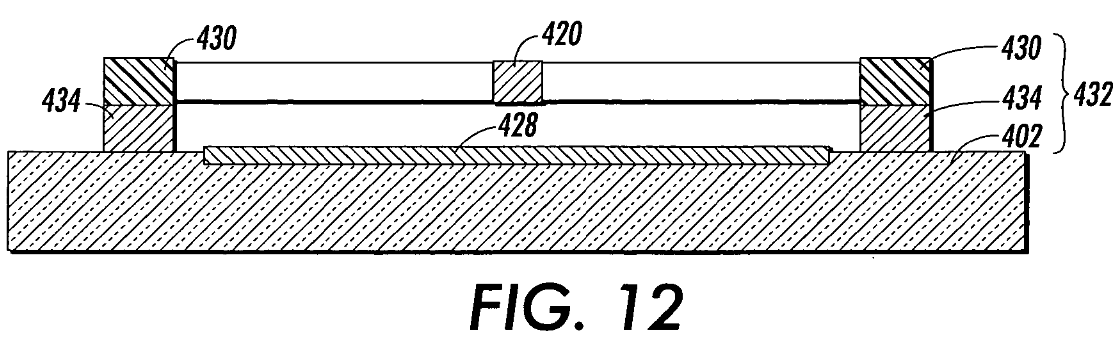

FIGS. 10–12 depict the thermal actuator 400 in greater detail.

Referring now to FIG. 10, there is shown an elevated top-down "birds-eye" view of the thermal actuator 400, including a first reference line 11 and a second reference line 12. As shown, the thermal actuator 400 comprises a substrate 402 having a surface 404; a first support 406 and a second support 408 disposed on the surface and extending orthogonally therefrom, a plurality of beams 412*a*–412*e* extending in parallel between the first support and the second support, thus forming a beam array 414, each beam being agonic and substantially straight; each beam of the beam array having a beam resistance 436 with a corresponding beam resistance value, the beams in the beam array having beam resistance values that vary based on a predetermined pattern; and an included coupling beam 420 extending orthogonally across the beam array to couple each array beam substantially at its mid-point.

The predetermined pattern is characterized in that, across the beam array 414 from one side 450 of the beam array to the opposite side 452 of the beam array, successive beam resistance values do not increase and at least sometimes decrease.

Each beam of the beam array 414 has a beam width 426 with a corresponding beam width value, with all beams of the beam array having substantially the same beam width value.

Each pair 422 of adjacent beams in the beam array 414 defines a beam spacing 424 with a corresponding beam spacing value, with all such pairs of adjacent beams in the beam array having substantially the same beam spacing value.

As shown in FIG. 10, with cross-reference to FIGS. 11–12, in one embodiment, each beam of the plurality of beams is arranged to be heated by a beam heater current 446 supplied by an included beam input 442 and beam output 444, thus causing or forming a heating of the plurality of beams.

As shown, the plurality of beams is arranged so that the heating of the plurality of beams causes a beam buckling and the coupling beam to translate in a predetermined direction 448.

Referring generally to FIGS. 10–12, in one embodiment, the thermal actuator 400 comprises a microelectromechanical or "MEMS" structure that is fabricated by any of surface and bulk micromachining.

In one embodiment, each beam of the plurality of beams is fabricated of a low-conductivity material of either monocrystalline silicon or polycrystalline silicon.

In one embodiment, each beam of the plurality of beams is fabricated in a device layer 430 of a silicon-on-insulator wafer 432.

In one embodiment, the first support 406 and the second support 408 are fabricated in a buried oxide layer 434 of a silicon-on-insulator wafer 432.

Referring again to FIGS. 4–6, there is described below a further aspect of the thermal actuator 200.

In FIGS. 4–6 there is shown the thermal actuator 200 comprising a substrate 202 having a surface 204; a first support 206 and a second support 208 disposed on the surface and extending orthogonally therefrom, a plurality of beams 212*a*–212*d* extending in parallel between the first support and the second support, thus forming a beam array 214, each beam being agonic and substantially straight; each beam of the beam array having a beam heating parameter 254 with a corresponding beam heating parameter value, the beams in the beam array having beam heating parameter values that vary based on a predetermined pattern; and an included coupling beam 220 extending orthogonally across the beam array to couple each array beam substantially at its mid-point.

An example of a beam heating parameter 254 is the beam width 226. The beam width w will effect the heat flow $\partial Q/\partial t$ through the beam under a temperature gradient $\partial T/\partial x$ as determined by Fourier's law of heat conduction in one dimension;

$$\partial Q/\partial t=\lambda(T)A\partial T/\partial x;$$

where the beam cross-section area A is given by the product of the beam width w and the beam thickness t;

$$A=(w)(t);$$

and $\lambda(T)$ is the temperature-dependent thermal conductivity of the beam. The beam width w will also effect the heat capacity of the beam, and thus the temperature of the beam as a function of time for a given heat input Q as given in one dimension by the heat equation;

$$\rho C\partial T/\partial t-\lambda(T)\partial T^2/\partial x^2=Q+h(t_{ext}-T)$$

where $\rho$ is the density of the beam, C is the heat capacity of the beam, h is the convective heat transfer coefficient, and $T_{ext}$ is the external temperature. For a given beam thickness t, a wider beam width w will increase the heat capacity of the beam, and thus decrease the temperature the beam will reach after a certain amount of time for a given heat input Q.

A further example of a beam heating parameter 254 is the beam spacing 224. Heat can be transferred between beams by conduction, convection and radiation. The smaller the beam spacing, the greater the heat transfer between beams. Heat lost by one beam can be transferred to a nearby beam, and vice-versa. Heat can also be lost from beams by conduction, convection and radiation to the surrounding environment. The larger the beam spacing, the greater the heat loss from a beam to the surrounding environment.

A final example of a beam heating parameter 254 is the beam electrical resistance R. The beam resistance R will effect the amount of heat Q generated by a current I flowing through a beam with a resistance R for a time t by;

$$Q=I^2Rt$$

as given by Joule's law.

Each beam of the beam array 214 is characterized by an average beam temperature 236*a*–236*d*, the average beam temperatures of the array beams thus forming an average beam temperature distribution 256. Further, there is provided heating means to heat each beam of the plurality of beams, thus causing or forming a heating of the plurality of beams. The heating means includes any of direct current Joule heating, by passing a beam heater current such as, for example, the beam current 246 through each beam, and indirect heating by conduction, convection or radiation from a heater layer such as, for example, the heater layer 228 disposed on the substrate, by passing a heater current through the heater layer. Further, in embodiments using a heater layer, the heater layer can be thermally isolated from the substrate as described in U.S. Pat. No. 5,706,041 and No. 5,851,412 to Joel Kubby, and in U.S. Pat. No. 6,362,512 to Joel Kubby et al., all of which patents are incorporated by reference herein.

The predetermined pattern is characterized in that, across the beam array 214 from one side 250 of the beam array to the opposite side 252 of the beam array, successive beam heating parameter values are arranged so that the beam temperature distribution becomes asymmetric based on the heating of the plurality of beams.

As shown, the plurality of beams is arranged so that the heating of the plurality of beams causes a beam buckling and the coupling beam 220 to translate in a predetermined direction 248.

Further heating of the plurality of the beams causes further expansion of the beams, thus causing the coupling beam to further translate in the predetermined direction 248.

In one embodiment, the heating of the plurality of beams comprises any of Joule heating, eddy current heating, conduction heating, convection heating and radiation heating.

Referring again to FIGS. 7–9, there is described below a further aspect of the thermal actuator 300.

In FIGS. 7–9 there is shown the thermal actuator 300 comprising a substrate 302 having a surface 304; a first support 306 and a second support 308 disposed on the surface and extending orthogonally therefrom, a plurality of beams 312*a*–312*e* extending in parallel between the first support and the second support, thus forming a beam array 314, each beam being agonic and substantially straight; each beam of the beam array having a beam heating parameter 354 with a corresponding beam heating parameter value, the beams in the beam array having beam heating parameter values that vary based on a predetermined pattern; and an included coupling beam 320 extending orthogonally across the beam array to couple each array beam substantially at its mid-point.

Each beam of the beam array 314 is characterized by an average beam temperature, the average beam temperatures of the array beams thus forming an average beam temperature distribution. Further, there is provided heating means to heat each beam of the plurality of beams, thus causing or forming a heating of the plurality of beams. The heating means includes any of direct current Joule heating, by passing a beam heater current such as, for example, the beam current 346 through each beam, and indirect heating by conduction, convection or radiation from a heater layer such as, for example, the heater layer 328 disposed on the substrate, by passing a heater current through the heater layer. Further, in embodiments using a heater layer, the heater layer can be thermally isolated from the substrate as described in U.S. Pat. Nos. 5,706,041 and No. 5,851,412 to Joel Kubby, and in U.S. Pat. No. 6,362,512 to Joel Kubby et al., all of which patents are incorporated by reference herein.

The predetermined pattern is characterized in that, across the beam array 314 from one side 350 of the beam array to the opposite side 352 of the beam array, successive beam heating parameter values are arranged so that the beam temperature distribution becomes asymmetric based on the heating of the plurality of beams.

As shown, the plurality of beams is arranged so that the heating of the plurality of beams causes a beam buckling and the coupling beam 320 to translate in a predetermined direction 348.

In one embodiment, the heating of the plurality of beams comprises any of Joule heating, eddy current heating, conduction heating, convection heating and radiation heating.

Referring again to FIGS. 10–12, there is described below a further aspect of the thermal actuator 400.

In FIGS. 10–12 there is shown the thermal actuator 400 comprising a substrate 402 having a surface 404; a first support 406 and a second support 408 disposed on the surface and extending orthogonally therefrom, a plurality of beams 412*a*–412*e* extending in parallel between the first support and the second support, thus forming a beam array 414, each beam being agonic and substantially straight; each beam of the beam array having a beam heating parameter 454 with a corresponding beam heating parameter value, the beams in the beam array having beam heating parameter values that vary based on a predetermined pattern; and an included coupling beam 420 extending orthogonally across the beam array to couple each array beam substantially at its mid-point.

Each beam of the beam array 414 is characterized by an average beam temperature, the average beam temperatures of the array beams thus forming an average beam temperature distribution. Further, there is provided heating means to heat each beam of the plurality of beams, thus causing or forming a heating of the plurality of beams. The heating means includes any of direct current Joule heating, by passing a beam heater current such as, for example, the beam current 446 through each beam, and indirect heating by conduction, convection or radiation from a heater layer such as, for example, the heater layer 428 disposed on the substrate, by passing a heater current through the heater layer. Further, in embodiments using a heater layer, the heater layer can be thermally isolated from the substrate as described in U.S. Pat. Nos. 5,706,041 and No. 5,851,412 to Joel Kubby, and in U.S. Pat. No. 6,362,512 to Joel Kubby et al., all of which patents are incorporated by reference herein.

The predetermined pattern is characterized in that, across the beam array 414 from one side 450 of the beam array to the opposite side 452 of the beam array, successive beam heating parameter values are arranged so that the beam temperature distribution becomes asymmetric based on the heating of the plurality of beams.

As shown, the plurality of beams is arranged so that the heating of the plurality of beams causes a beam buckling and the coupling beam 420 to translate in a predetermined direction 448.

In one embodiment, the heating of the plurality of beams comprises any of Joule heating, eddy current heating, conduction heating, convection heating and radiation heating.

Figure 13:
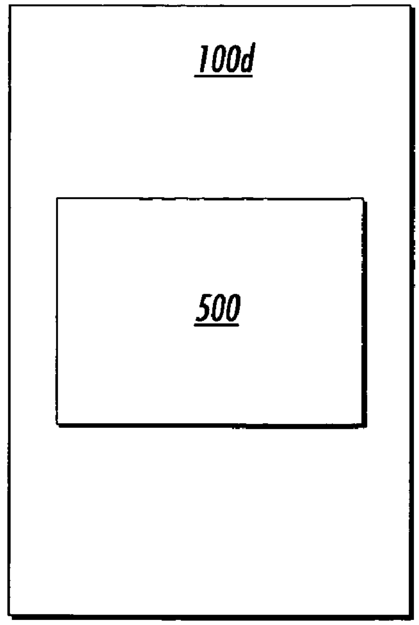
FIG. 13 is a block diagram of an optical waveguide switch 100_d_ comprising a fourth embodiment 500 of a thermal actuator.

Referring now to FIG. 13, there is shown a block diagram of an optical waveguide switch 100*d* comprising a fourth embodiment 500 of a thermal actuator. The thermal actuator 500 is described in greater detail in connection with FIGS. 19–24 below.

Figure 14:
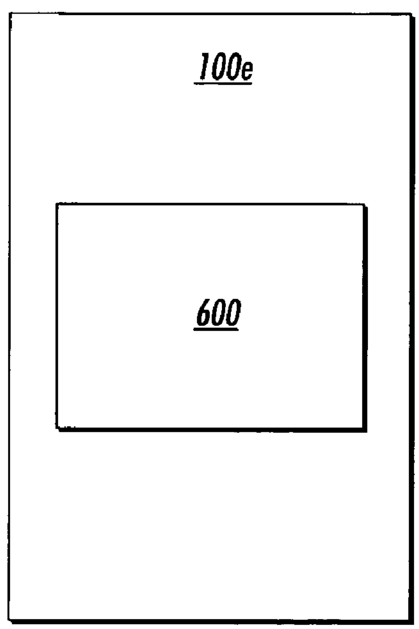
FIG. 14 is a block diagram of an optical waveguide switch 100_e_ comprising a fifth embodiment 600 of thermal actuator.

Referring now to FIG. 14, there is shown a block diagram of an optical waveguide switch 100*e* comprising a fifth embodiment 600 of a thermal actuator. The thermal actuator 600 is described in greater detail in connection with FIGS. 25–30 below.

Figure 15:
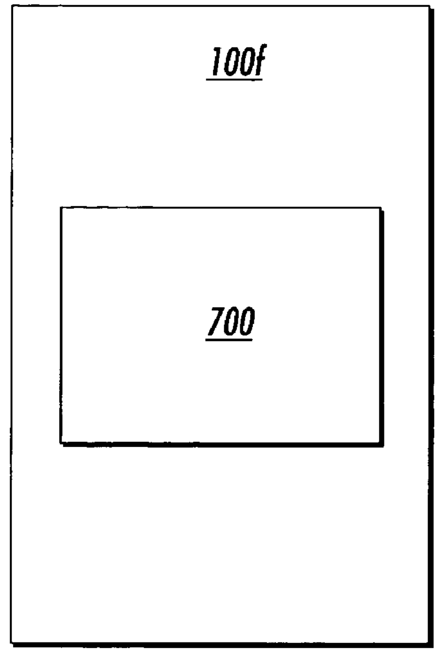
FIG. 15 is a block diagram of an optical waveguide switch 100_f_ comprising a sixth embodiment 700 of a thermal actuator.

Referring now to FIG. 15, there is shown a block diagram of an optical waveguide switch 100*f* comprising a sixth embodiment 700 of a thermal actuator. The thermal actuator 700 is described in greater detail in connection with FIGS. 31–36 below.

Figure 16:
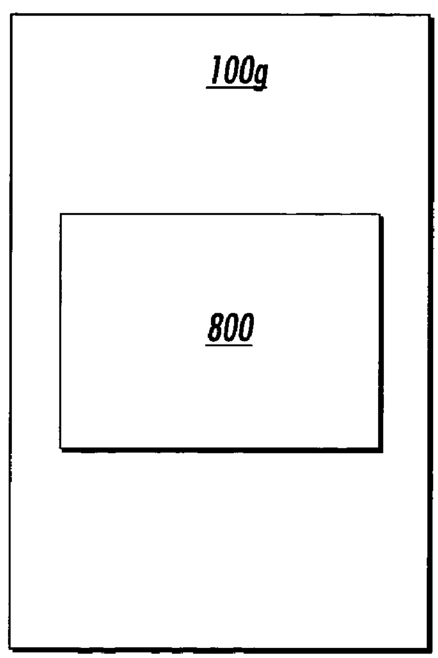
FIG. 16 is a block diagram of an optical waveguide switch 100_g_ comprising a seventh embodiment 800 of a thermal actuator.

Referring now to FIG. 16, there is shown a block diagram of an optical waveguide switch 100*g* comprising a seventh embodiment 800 of a thermal actuator. The thermal actuator 800 is described in greater detail in connection with FIGS. 37–42 below.

Figure 17:
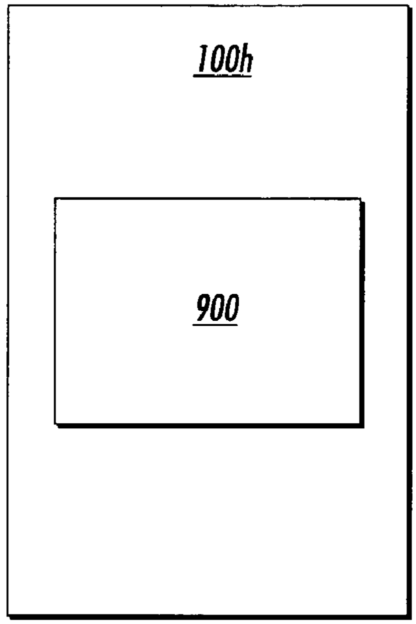
FIG. 17 is a block diagram of an optical waveguide switch 100_h_ comprising an eighth embodiment 900 of thermal actuator.

Referring now to FIG. 17, there is shown a block diagram of an optical waveguide switch 100*h* comprising an eighth embodiment 900 of a thermal actuator. The thermal actuator 900 is described in greater detail in connection with FIGS. 43–48 below.

Figure 18:
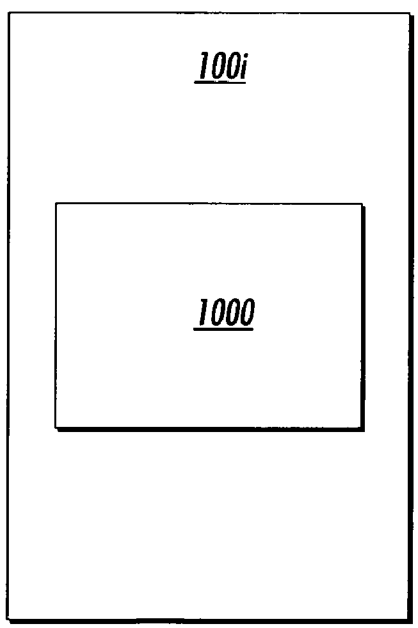
FIG. 18 is a block diagram of an optical waveguide switch 100_i_ comprising a ninth embodiment 1000 of a thermal actuator.

Referring now to FIG. 18, there is shown a block diagram of an optical waveguide switch 100*i* comprising a ninth embodiment 1000 of a thermal actuator. The thermal actuator 1000 is described in greater detail in connection with FIGS. 49–54 below.

FIGS. 19–24 depict the thermal actuator 500 in greater detail.

Figure 19:
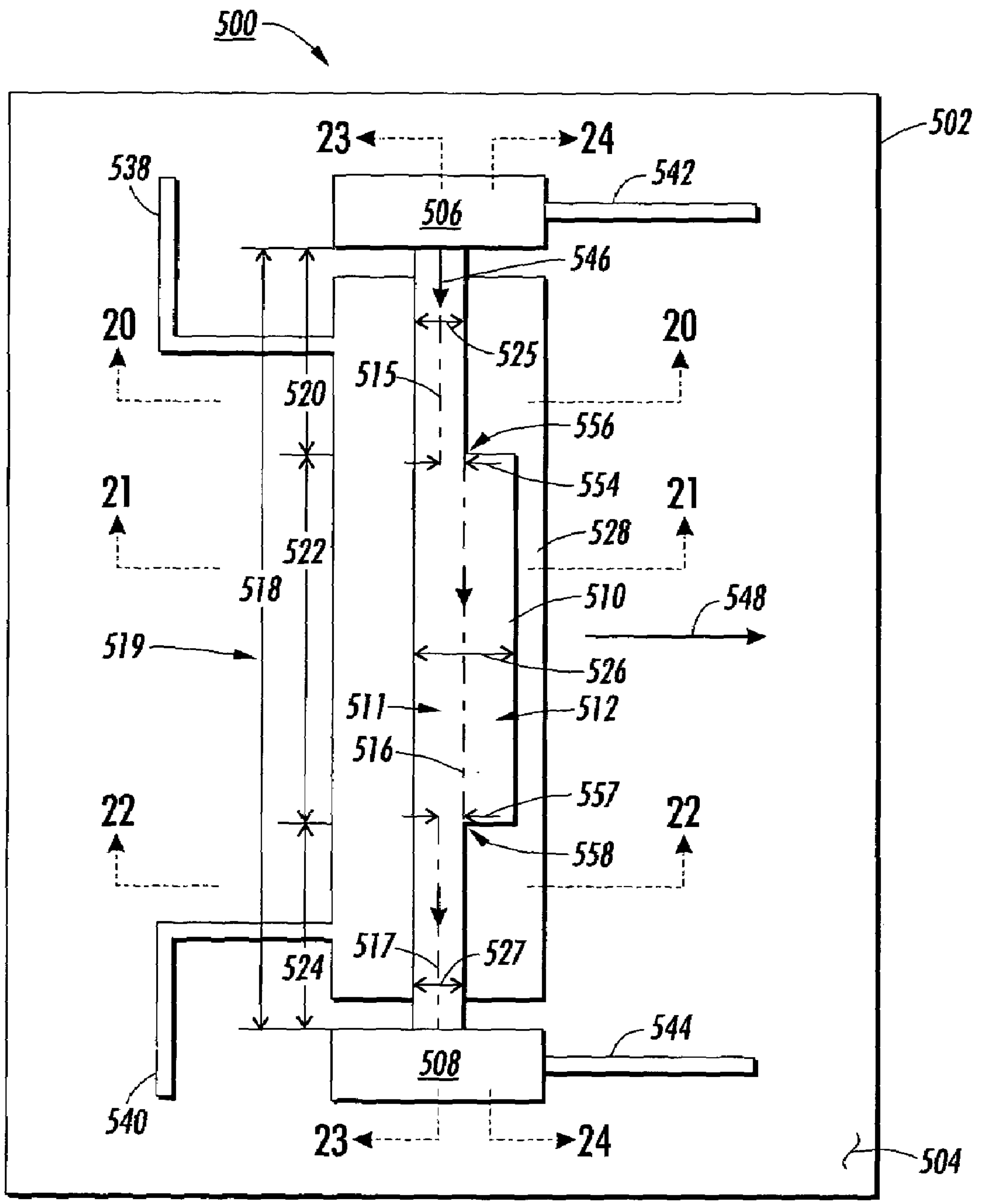
FIG. 19 is an elevated top-down "birds-eye" view of the fourth embodiment 500 of the thermal actuator, including reference lines 20–24.
Figure 20:
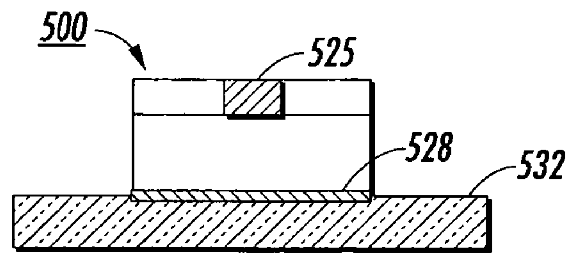
FIG. 20 is a "cut-away" side or profile view of the thermal actuator 500 along the reference line 20.
Figure 21:
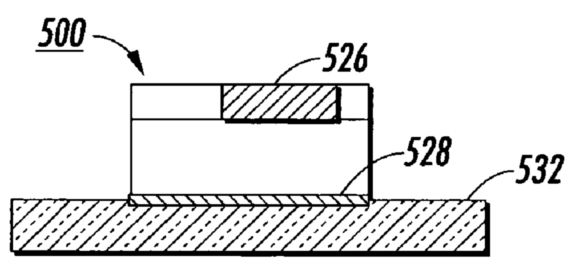
FIG. 21 is a "cut-away" side or profile view of the thermal actuator 500 along the reference line 21.
Figure 22:
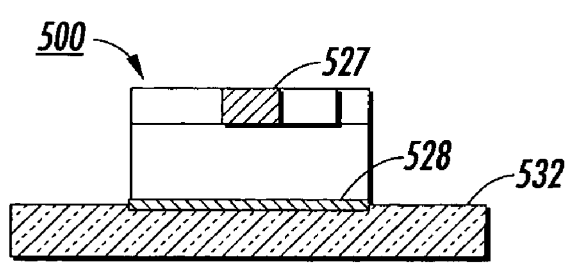
FIG. 22 is a "cut-away" side or profile view of the thermal actuator 500 along the reference line 22.
Figure 23:
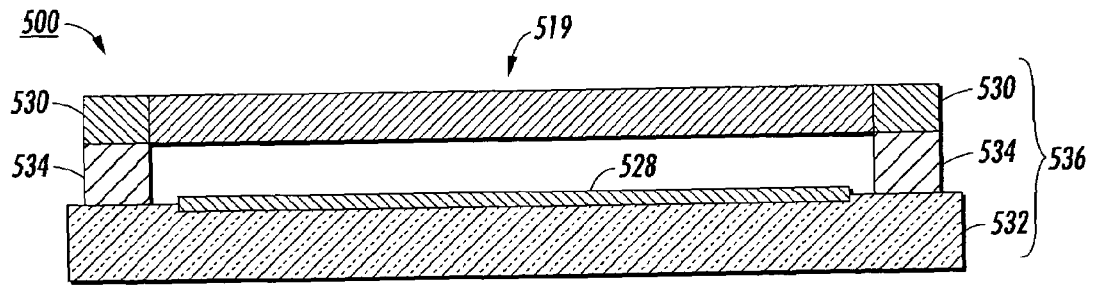
FIG. 23 is a "cut-away" side or profile view of the thermal actuator 500 along the reference line 23.
Figure 24:
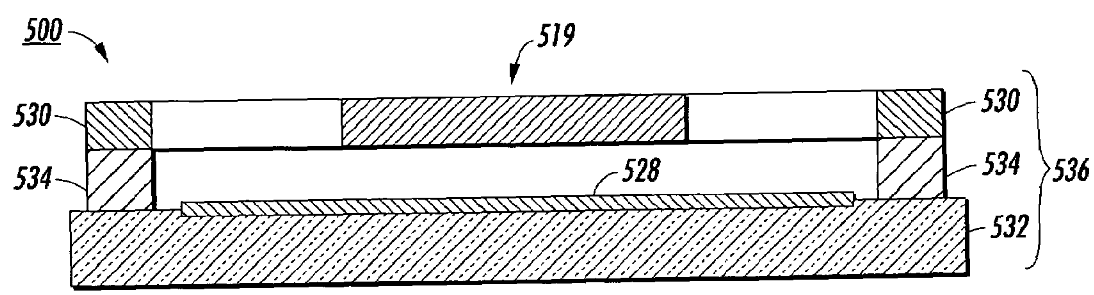
FIG. 24 is a "cut-away" side or profile view of the thermal actuator 500 along the reference line 24.

Referring now to FIG. 19, there is shown an elevated top-down "birds-eye" view of the thermal actuator 500, including five (5) reference lines numbered 20–24.

As shown in FIGS. 19–24, the thermal actuator 500 comprises a substrate 502 having a surface 504; a first support 506 and a second support 508 disposed on the surface 504 and extending orthogonally therefrom; a beam 510 extending between the first support 506 and the second support 508, the beam 510 having a first side 511, a second side 512, a beam length 518 and a beam mid-point 519, the beam 510 being substantially straight along the first side 511; the beam comprised of a plurality of beam segments 520, 522, 524, each beam segment of the plurality of beam segments having a beam segment width 525, 526, 527 orthogonal to the beam length 518, the beam 510 thus forming a corresponding plurality of beam segment widths; wherein the plurality of beam segment widths 525, 526, 527 corresponding to the beam 510 vary along the beam length 518 based on a predetermined pattern; so that a heating of the beam 510 causes a beam buckling and the beam mid-point 519 to translate in a predetermined direction 548 generally normal to and outward from the second side 512.

As shown in FIG. 19, in one embodiment, the predetermined pattern is characterized in that, along the beam length 518 from the first support 506 to the beam mid-point 519, beam segment widths 525, 526 corresponding to successive beam segments 520, 522 do not decrease and at least sometimes increase, and along the beam length 518 from the beam mid-point 519 to the second support 508, beam segment widths 526, 527 corresponding to successive beam segments 522, 524 do not increase and at least sometimes decrease.

In one embodiment, the heating of the beam 510 is provided by an included heater layer 528 disposed on the surface 504, the heater layer coupled to a heater layer input 538 and a heater layer output 540.

In another embodiment, the heating of the beam 510 is provided by a beam heater current 546 supplied by an included beam input 542 and beam output 544.

In one embodiment, the beam is fabricated of a low-conductivity material of either monocrystalline silicon or polycrystalline silicon.

In another embodiment, the beam is fabricated in a device layer of a silicon-on-insulator wafer.

As shown in FIG. 19, in one embodiment, the beam 510 comprises exactly three (3) beam segments 520, 522, 524.

In another embodiment, the beam 510 comprises a plurality (n) of beam segments, where n does not equal 3. In this embodiment, for example, n equals 2, 4, 5, 12, 15, 32, 82, 109, 188, 519, 1003, etc.

As shown in FIG. 19, in one embodiment, the beam 510 comprises exclusively beam segments 520, 522, 524 having substantially parallel sides.

As further shown in FIG. 19, in one embodiment, the beam 510 comprises exactly two (2) beam segments 520, 524 that are substantially equal with respect to their corresponding beam segment lengths and beam segment widths 525, 527.

FIGS. 25–30 depict the thermal actuator 600 in greater detail.

Figure 25:
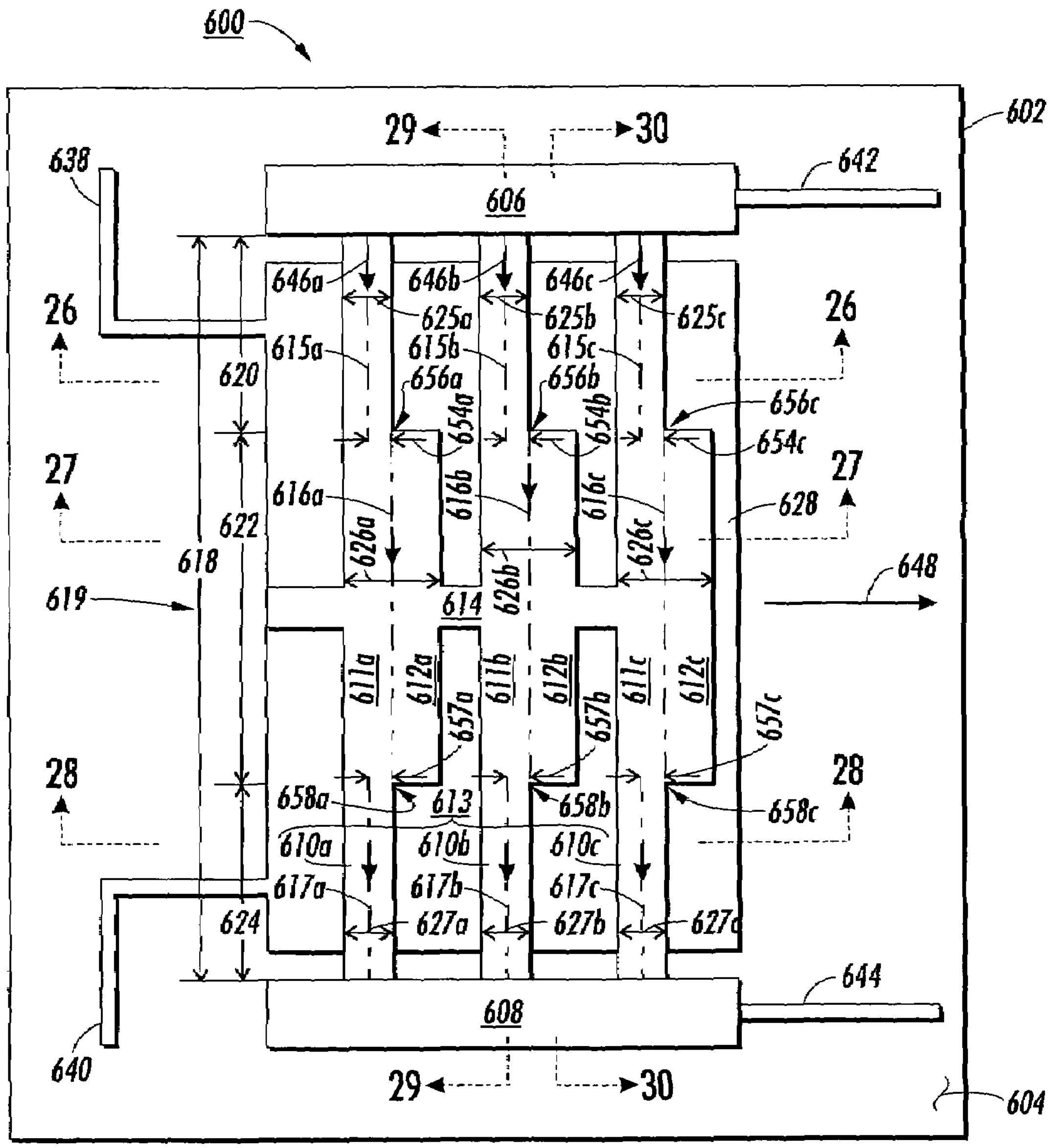
FIG. 25 is an elevated top-down "birds-eye" view of the fifth embodiment 600 of the thermal actuator, including reference lines 26–30.
Figure 26:
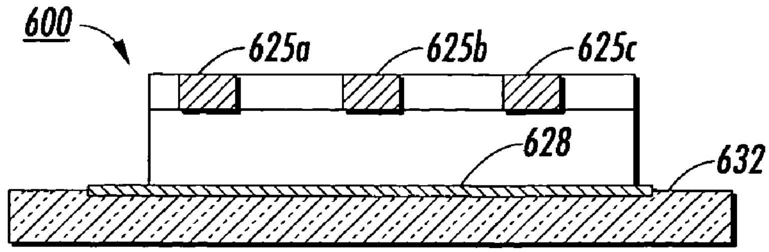
FIG. 26 is a "cut-away" side or profile view of the thermal actuator 600 along the reference line 26.
Figure 27:
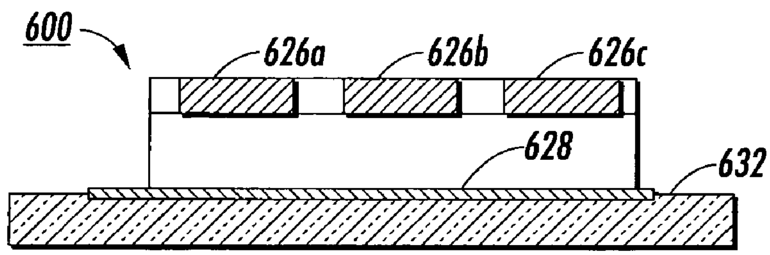
FIG. 27 is a "cut-away" side or profile view of the thermal actuator 600 along the reference line 27.
Figure 28:
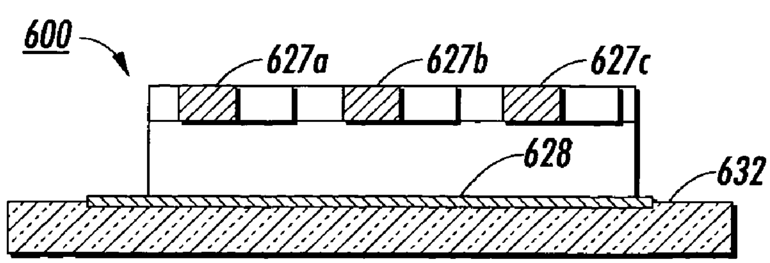
FIG. 28 is a "cut-away" side or profile view of the thermal actuator 600 along the reference line 28.
Figure 29:
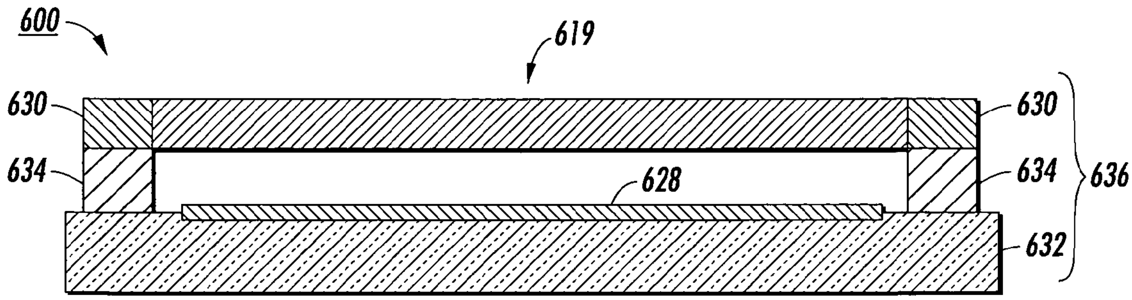
FIG. 29 is a "cut-away" side or profile view of the thermal actuator 600 along the reference line 29.
Figure 30:
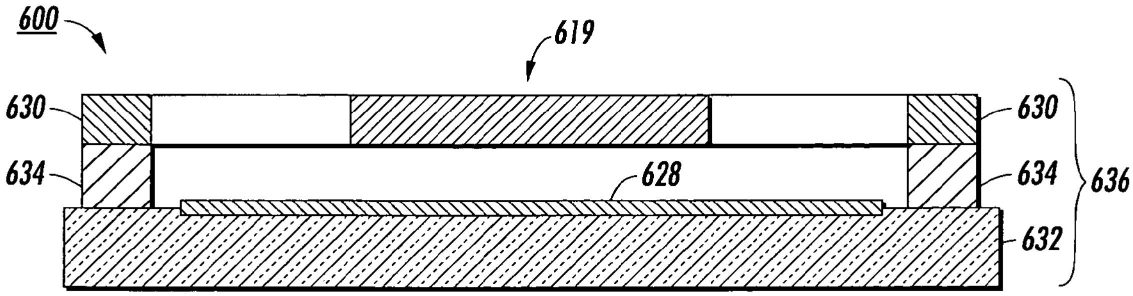
FIG. 30 is a "cut-away" side or profile view of the thermal actuator 600 along the reference line 30.

Referring now to FIG. 25, there is shown an elevated top-down "birds-eye" view of the thermal actuator 600, including five (5) reference lines numbered 26–30.

As shown in FIGS. 25–30, the thermal actuator 600 comprises a substrate 602 having a surface 604; a first support 606 and a second support 608 disposed on the surface 604 and extending orthogonally therefrom; a plurality of beams 610*a*, 610*b*, 610*c* extending in parallel between the first support 606 and the second support 608, thus forming a beam array 613; each beam 610*a*, 610*b*, 610*c* of the beam array 613 having a first side 611*a*, 611*b*, 611*c*, a second side 612*a*, 612*b*, 612*c*, a beam length 618 and a beam mid-point 619, each beam being substantially straight along its first side 611*a*, 611*b*, 611*c*; each beam 610*a*, 610*b*, 610*c* of the beam array 613 comprised of a plurality of beam segments 620, 622, 624, each beam segment of the plurality of beam segments having a beam segment width 625*a*, 626*a*, 627*a*; 625*b*, 626*b*, 627*b*; 625*c*, 626*c*, 627*c* orthogonal to the beam length 618, each beam thus forming a corresponding plurality of beam segment widths; wherein the plurality of beam segment widths 625*a*, 626*a*, 627*a*; 625*b*, 626*b*, 627*b*; 625*c*, 626*c*, 627*c* corresponding to each beam 610*a*, 610*b*, 610*c* vary along the beam length 618 based on a predetermined pattern; an included coupling beam 614 extending orthogonally across the beam array 613 to couple each beam 610*a*, 610*b*, 610*c* of the beam array 613 substantially at the corresponding beam mid-point 619; so that a heating of the beam array causes a beam array buckling and the coupling beam 614 to translate in a predetermined direction 648 generally normal to and outward from the second sides 612*a*, 612*b*, 612*c* of the array beams 610*a*, 610*b*, 610*c*.

In one embodiment, the predetermined pattern is characterized in that, along the beam length 618 from the first support 606 to the beam mid-point 619, beam segment widths 625*a*, 626*a*, 627*a*; 625*b*, 626*b*, 627*b* corresponding to successive beam segments 620, 622 do not decrease and at least sometimes increase, and along the beam length 618 from the beam mid-point 619 to the second support 608, beam segment widths 625*b*, 626*b*, 627*b*; 625*c*, 626*c*, 627*c* corresponding to successive beam segments 622, 624 do not increase and at least sometimes decrease.

In one embodiment, the heating of the beam array is provided by an included heater layer 628 disposed on the surface 604, the heater layer coupled to a heater layer input 638 and a heater layer output 640.

In another embodiment, each beam of the beam array is heated by a beam heater current 646*a*, 646*b*, 646*c* supplied by an included beam input 642 and beam output 644, thus forming the heating of the beam array.

In one embodiment, each beam of the beam array is fabricated of a low-conductivity material of either monocrystalline silicon or polycrystalline silicon.

In another embodiment, each beam of the beam array is fabricated in a device layer of a silicon-on-insulator wafer.

As shown in FIG. 25, in one embodiment, each beam 610*a*, 610*b*, 610*c* of the beam array 613 comprises exactly three (3) beam segments 620, 622, 624.

In another embodiment, each beam of the beam array 613 comprises a plurality (n) of beam segments, where n does not equal 3. In this embodiment, for example, n equals 2, 4, 5, 12, 15, 32, 82, 109, 188, 519, 1003, etc.

As shown in FIG. 25, in one embodiment, the beam array 613 comprises exactly three (3) beams.

In another embodiment, the beam array 613 comprises a plurality (n) of beams, where n does not equal 3. In this embodiment, for example, n equals 2, 4, 5, 12, 15, 32, 82, 109, 188, 519, 1003, etc.

FIGS. 31–36 depict the thermal actuator 700 in greater detail.

Figure 31:
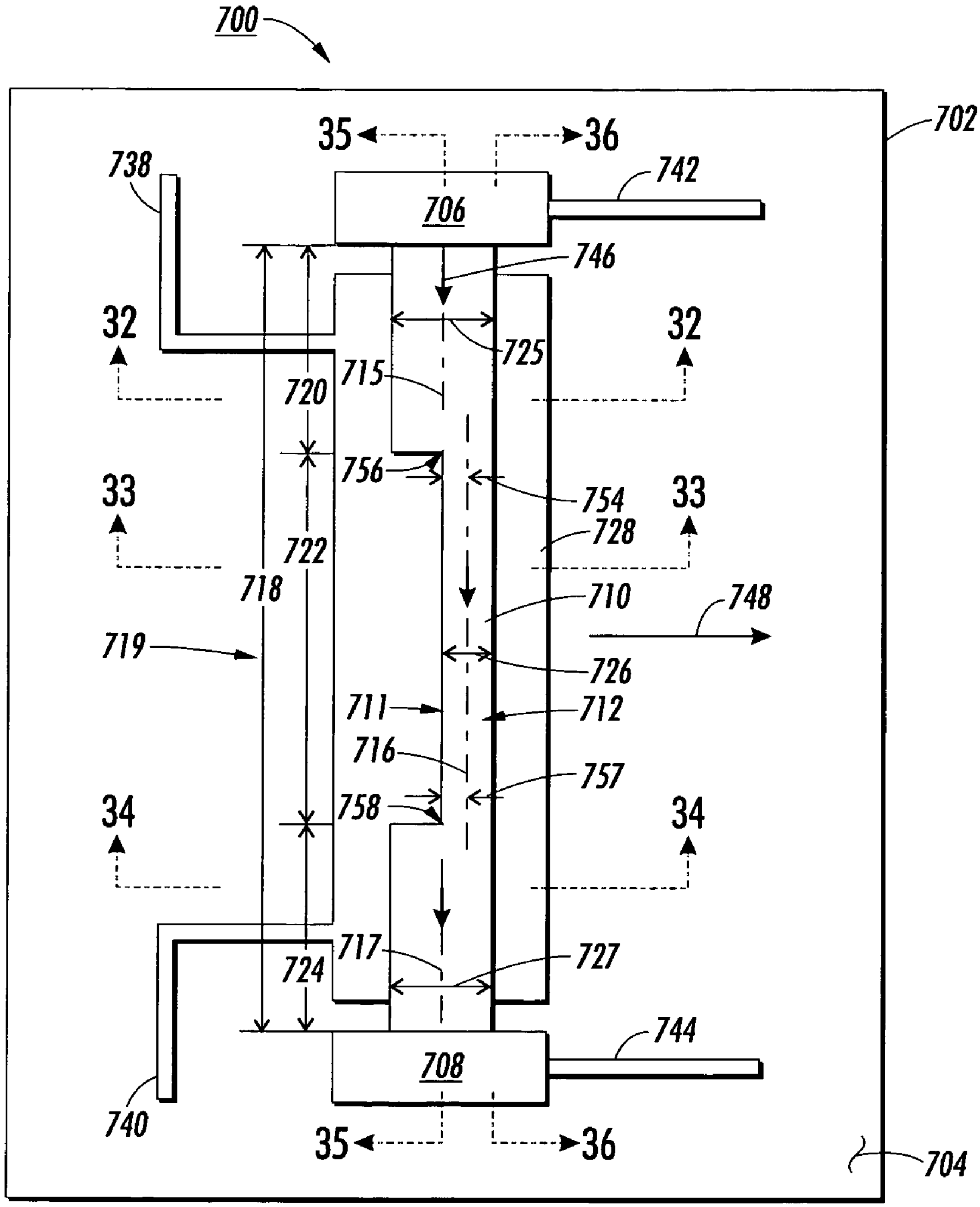
FIG. 31 is an elevated top-down "birds-eye" view of the sixth embodiment 700 of the thermal actuator, including reference lines 32–36.
Figure 32:
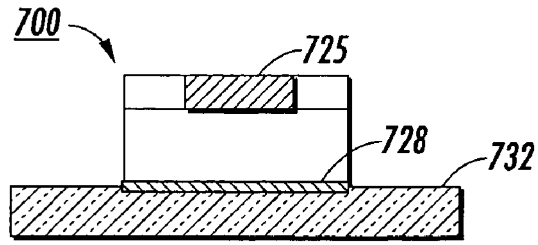
FIG. 32 is a "cut-away" side or profile view of the thermal actuator 700 along the reference line 32.
Figure 33:
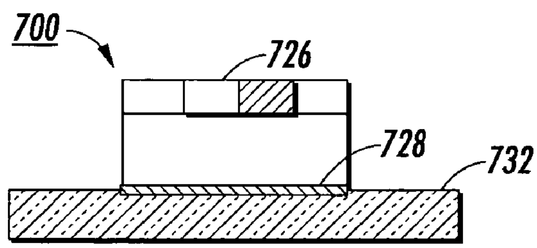
FIG. 33 is a "cut-away" side or profile view of the thermal actuator 700 along the reference line 33.
Figure 34:
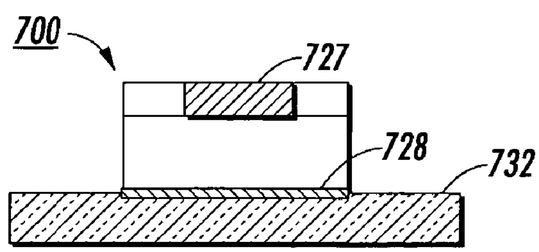
FIG. 34 is a "cut-away" side or profile view of the thermal actuator 700 along the reference line 34.
Figure 35:
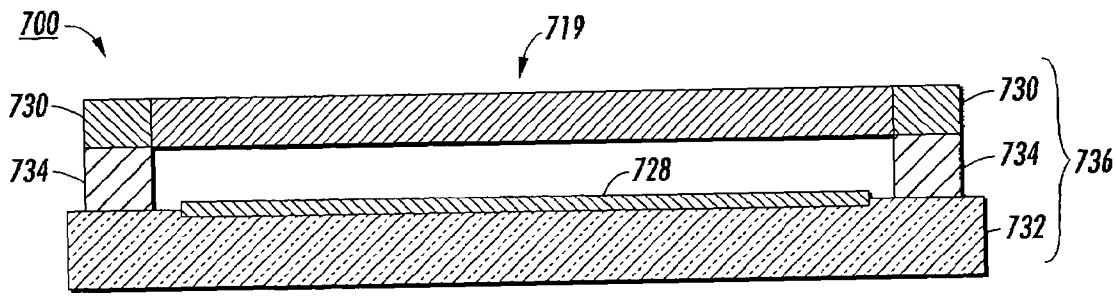
FIG. 35 is a "cut-away" side or profile view of the thermal actuator 700 along the reference line 35.
Figure 36:
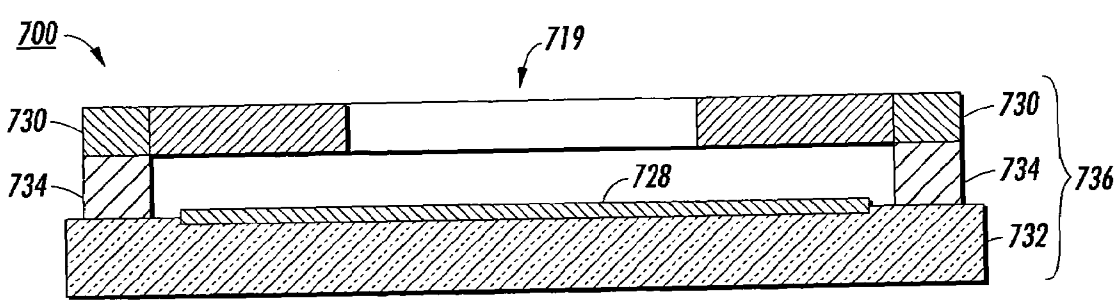
FIG. 36 is a "cut-away" side or profile view of the thermal actuator 700 along the reference line 36.

Referring now to FIG. 31, there is shown an elevated top-down "birds-eye" view of the thermal actuator 700, including five (5) reference lines numbered 32–36.

As shown in FIGS. 31–36, the thermal actuator 700 comprises a substrate 702 having a surface 704; a first support 706 and a second support 708 disposed on the surface 704 and extending orthogonally therefrom; a beam 710 extending between the first support 706 and the second support 708, the beam 710 having a first side 711, a second side 712, a beam length 718 and a beam mid-point 719, the beam 710 being substantially straight along the second side 712; the beam comprised of a plurality of beam segments 720, 722, 724, each beam segment of the plurality of beam segments being having a beam segment width 725, 726, 727 orthogonal to the beam length 718, the beam 710 thus forming a corresponding plurality of beam segment widths; wherein the plurality of beam segment widths 725, 726, 727 corresponding to the beam 710 vary along the beam length 718 based on a predetermined pattern; so that a heating of the beam 710 causes a beam buckling and the beam mid-point 719 to translate in a predetermined direction 748 generally normal to and outward from the second side 712.

As shown in FIG. 31, in one embodiment, the predetermined pattern is characterized in that, along the beam length 718 from the first support 706 to the beam mid-point 719, beam segment widths 725, 726 corresponding to successive beam segments 720, 722 do not increase and at least sometimes decrease, and along the beam length 718 from the beam mid-point 719 to the second support 708, beam segment widths 726, 727 corresponding to successive beam segments 722, 724 do not decrease and at least sometimes increase.

In one embodiment, the heating of the beam 710 is provided by an included heater layer 728 disposed on the surface 704, the heater layer coupled to a heater layer input 738 and a heater layer output 740.

In another embodiment, the heating of the beam 710 is provided by a beam heater current 746 supplied by an included beam input 742 and beam output 744.

In one embodiment, the beam is fabricated of a low-conductivity material of either monocrystalline silicon or polycrystalline silicon.

In another embodiment, the beam is fabricated in a device layer of a silicon-on-insulator wafer.

As shown in FIG. 31, in one embodiment, the beam 710 comprises exactly three (3) beam segments 720, 722, 724.

In another embodiment, the beam 710 comprises a plurality (n) of beam segments, where n does not equal 3. In this embodiment, for example, n equals 2, 4, 5, 12, 15, 32, 82, 109, 188, 519, 1003, etc.

As shown, in one embodiment, the beam 710 comprises exclusively beam segments 720, 722, 724 having substantially parallel sides.

As shown, in one embodiment, the beam 710 comprises exactly two (2) beam segments 720, 724 that are substantially equal with respect to their corresponding beam segment lengths and beam segment widths 725, 727.

FIGS. 37–42 depict the thermal actuator 800 in greater detail.

Figure 37:
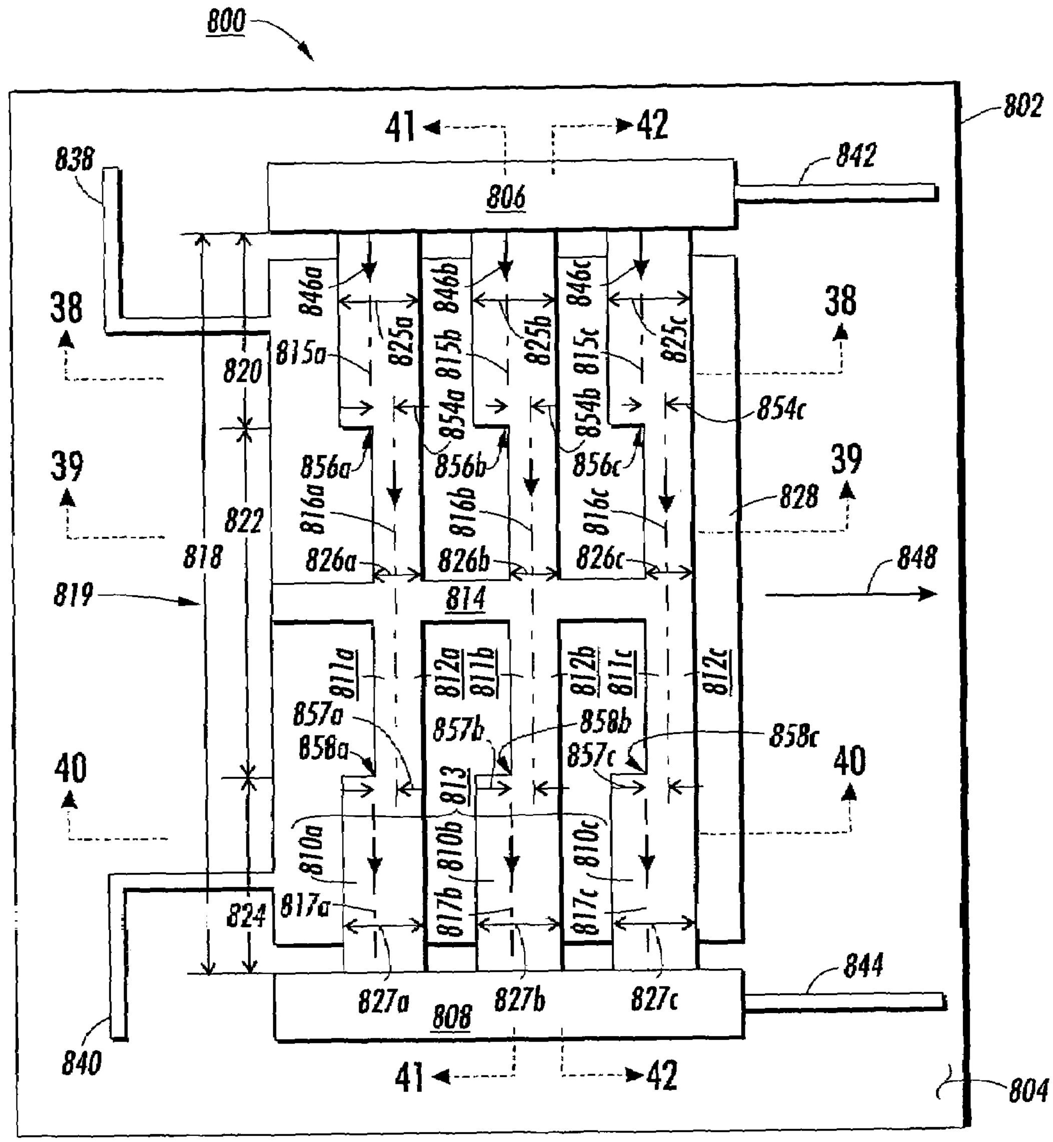
FIG. 37 is an elevated top-down "birds-eye" view of the seventh embodiment 800 of the thermal actuator, including reference lines 38–42.
Figure 38:
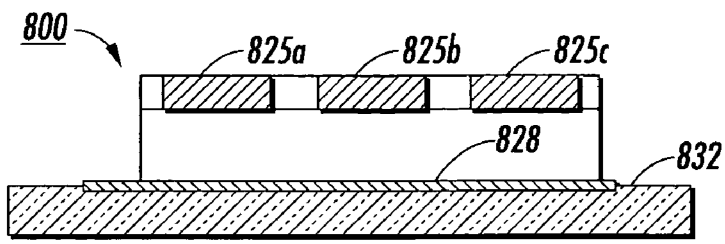
FIG. 38 is a "cut-away" side or profile view of the thermal actuator 800 along the reference line 38.
Figure 39:
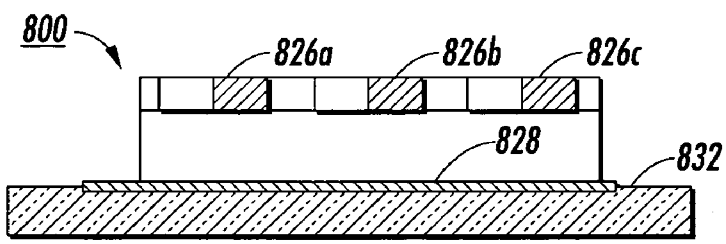
FIG. 39 is a "cut-away" side or profile view of the thermal actuator 800 along the reference line 39.
Figure 40:
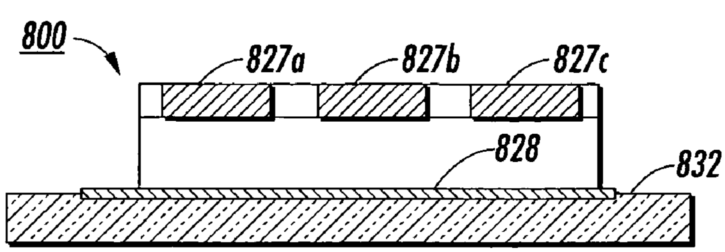
FIG. 40 is a "cut-away" side or profile view of the thermal actuator 800 along the reference line 40.
Figure 41:
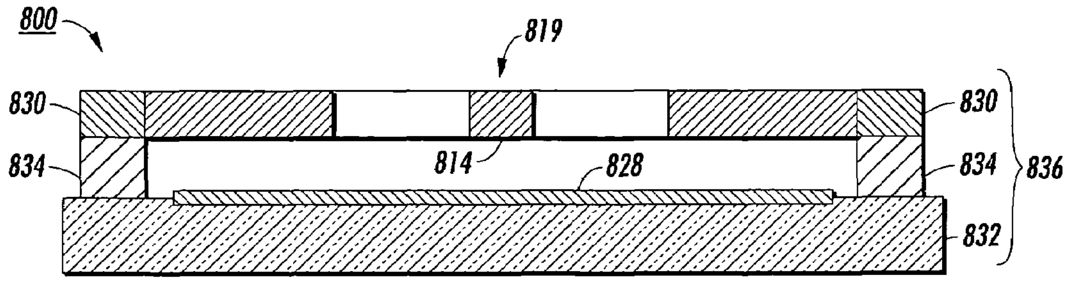
FIG. 41 is a "cut-away" side or profile view of the thermal actuator 800 along the reference line 41.
Figure 42:
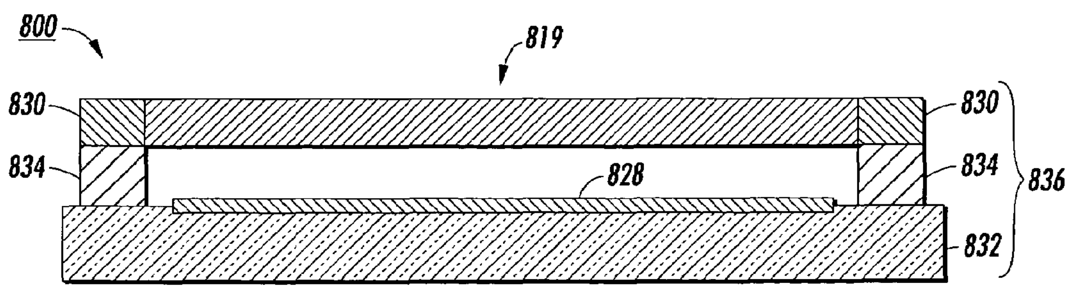
FIG. 42 is a "cut-away" side or profile view of the thermal actuator 800 along the reference line 42.

Referring now to FIG. 37, there is shown an elevated top-down "birds-eye" view of the thermal actuator 800, including five (5) reference lines numbered 38–42.

As shown in FIGS. 37–42, the thermal actuator 800 comprises a substrate 802 having a surface 804; a first support 806 and a second support 808 disposed on the surface 804 and extending orthogonally therefrom; a plurality of beams 810*a*, 810*b*, 810*c* extending in parallel between the first support 806 and the second support 808, thus forming a beam array 813; each beam 810*a*, 810*b*, 810*c* of the beam array 813 having a first side 811*a*, 811*b*, 811*c*, a second side 812*a*, 812*b*, 812*c*, a beam length 818 and a beam mid-point 819, each beam being substantially straight along its second side 812*a*, 812*b*, 812*c*; each beam 810*a*, 810*b*, 810*c* of the beam array 813 comprised of a plurality of beam segments 820, 822, 824, each beam segment of the plurality of beam segments having a beam segment width 825*a*, 826*a*, 827*a*; 825*b*, 826*b*, 827*b*; 825*c*, 826*c*, 827*c* orthogonal to the beam length 818, each beam thus forming a corresponding plurality of beam segment widths; wherein the plurality of beam segment widths 825*a*, 826*a*, 827*a*; 825*b*, 826*b*, 827*b*; 825*c*, 826*c*, 827*c* corresponding to each beam 810*a*, 810*b*, 810*c* vary along the beam length 818 based on a predetermined pattern; an included coupling beam 814 extending orthogonally across the beam array 813 to couple each beam 810*a*, 810*b*, 810*c* of the beam array 813 substantially at the corresponding beam mid-point 819; so that a heating of the beam array causes a beam array buckling and the coupling beam 814 to translate in a predetermined direction 848 generally normal to and outward from the second sides 812*a*, 812*b*, 812*c* of the array beams 810*a*, 810*b*, 810*c*.

As shown in FIG. 37, in one embodiment, the predetermined pattern is characterized in that, along the beam length 818 from the first support 806 to the beam mid-point 819, beam segment widths 825*a*, 826*a*, 827*a*; 825*b*, 826*b*, 827*b* corresponding to successive beam segments 820, 822 do not increase and at least sometimes decrease, and along the beam length 818 from the beam mid-point 819 to the second support 808, beam segment widths 825*b*, 826*b*, 827*b*; 825*c*, 826*c*, 827*c* corresponding to successive beam segments 822, 824 do not decrease and at least sometimes increase.

In one embodiment, the heating of the beam array is provided by an included heater layer 828 disposed on the surface 804, the heater layer coupled to a heater layer input 838 and a heater layer output 840.

In another embodiment, each beam of the beam array is heated by a beam heater current 846*a*, 846*b*, 846*c* supplied by an included beam input 842 and beam output 844, thus forming the heating of the beam array.

In one embodiment, each beam of the beam array is fabricated of a low-conductivity material of either monocrystalline silicon or polycrystalline silicon.

In another embodiment, each beam of the beam array is fabricated in a device layer of a silicon-on-insulator wafer.

As shown in FIG. 37, in one embodiment, each beam 810*a*, 810*b*, 810*c* of the beam array 813 comprises exactly three (3) beam segments 820, 822, 824.

In another embodiment, each beam of the beam array 813 comprises a plurality (n) of beam segments, where n does not equal 3. In this embodiment, for example, n equals 2, 4, 5, 12, 15, 32, 82, 109, 188, 519, 1003, etc.

As shown in FIG. 37, in one embodiment, the beam array 813 comprises exactly three (3) beams.

In another embodiment, the beam array 813 comprises a plurality (n) of beams, where n does not equal 3. In this embodiment, for example, n equals 2, 4, 5, 12, 15, 32, 82, 109, 188, 519, 1003, etc.

FIGS. 43–48 depict the thermal actuator 900 in greater detail.

Figure 43:
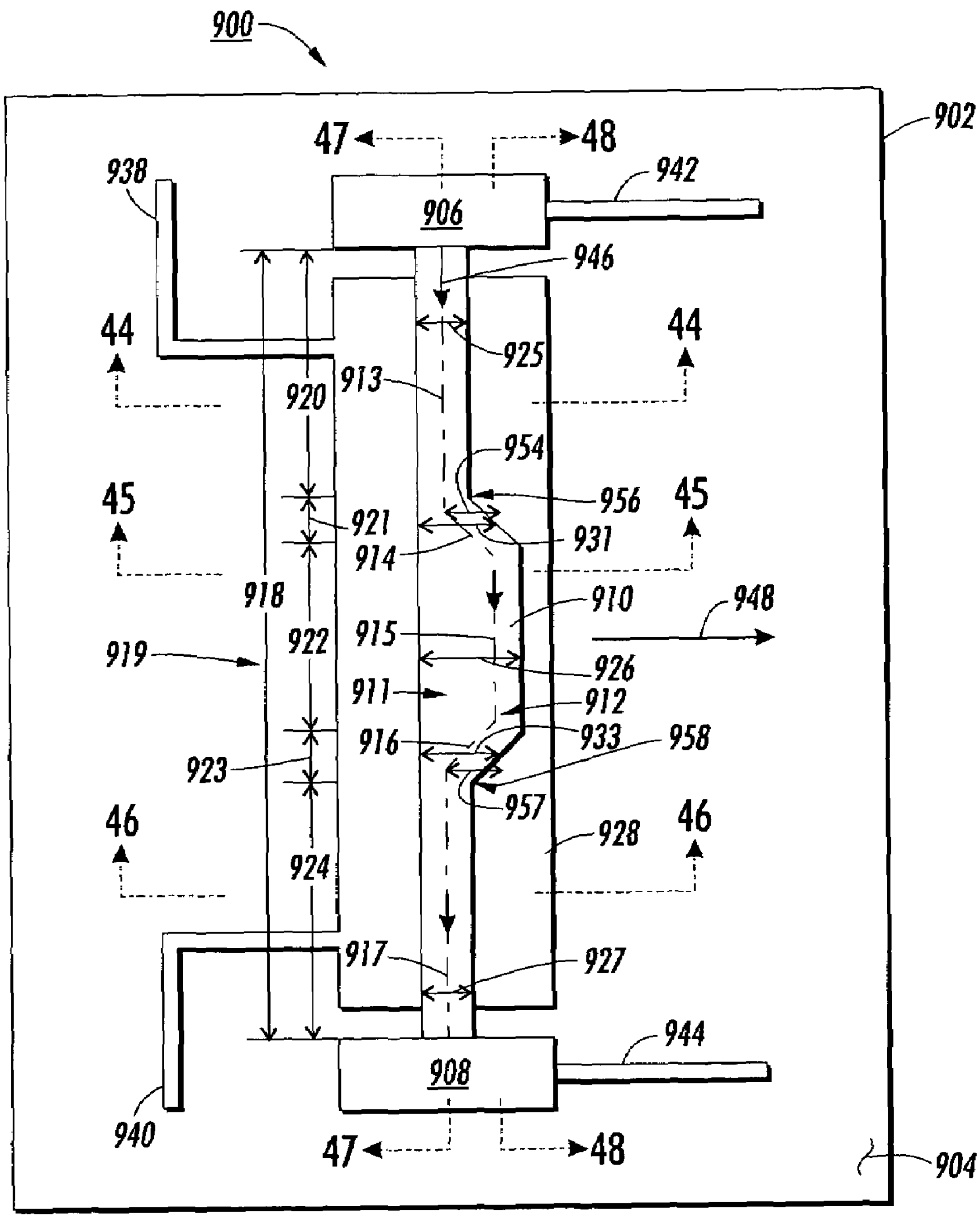
FIG. 43 is an elevated top-down "birds-eye" view of then eighth embodiment 900 of the thermal actuator, including reference lines 44–48.
Figure 44:
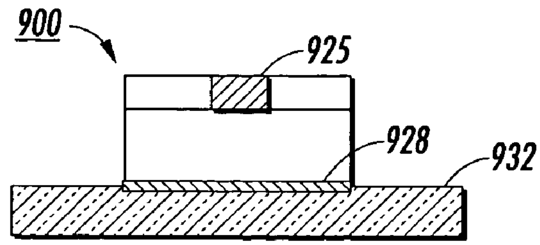
FIG. 44 is a "cut-away" side or profile view of the thermal actuator 900 along the reference line 44.
Figure 45:
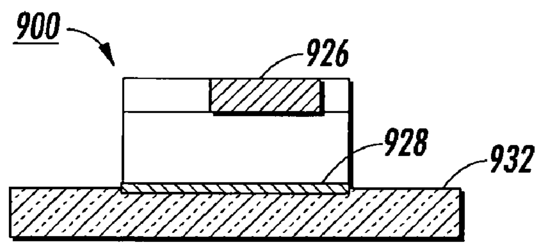
FIG. 45 is a "cut-away" side or profile view of the thermal actuator 900 along the reference line 45.
Figure 46:
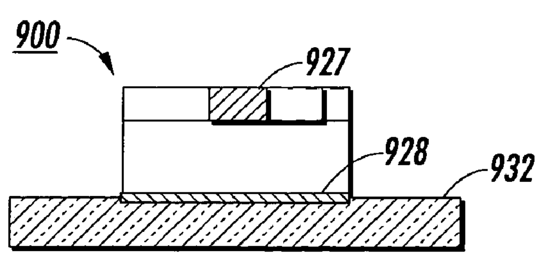
FIG. 46 is a "cut-away" side or profile view of the thermal actuator 900 along the reference line 46.
Figure 47:
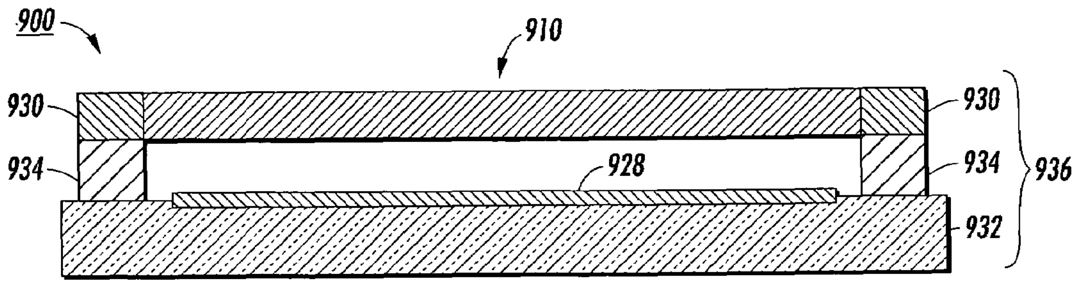
FIG. 47 is a "cut-away" side or profile view of the thermal actuator 900 along the reference line 47.
Figure 48:
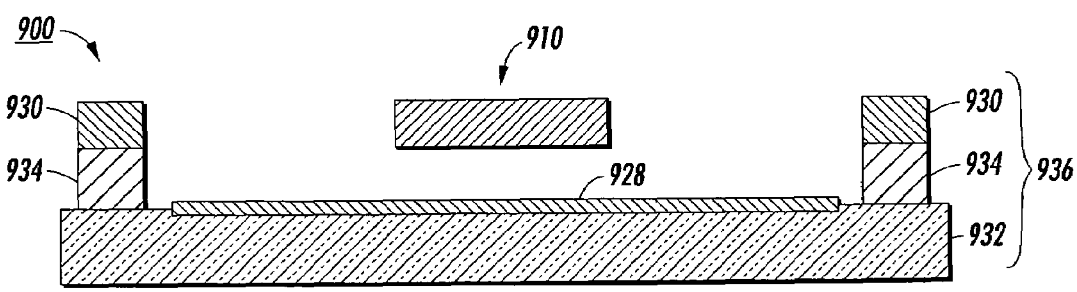
FIG. 48 is a "cut-away" side or profile view of the thermal actuator 900 along the reference line 48.

Referring now to FIG. 43, there is shown an elevated top-down "birds-eye" view of the thermal actuator 900, including five (5) reference lines numbered 44–48.

As shown in FIGS. 43–48, the thermal actuator 900 comprises a substrate 902 having a surface 904; a first support 906 and a second support 908 disposed on the surface 904 and extending orthogonally therefrom; a beam 910 extending between the first support 906 and the second support 908, the beam 910 having a first side 911, a second side 912, a beam length 918 and a beam mid-point 919, the beam 910 being substantially straight along the first side 911; the beam comprised of a plurality of beam segments 920, 921, 922, 923, 924, each beam segment of the plurality of beam segments having a beam segment average width 925, 931, 926, 933, 927 orthogonal to the beam length 918, the beam 910 thus forming a corresponding plurality of beam segment average widths; wherein the plurality of beam segment average widths 925, 931, 926, 933, 927 corresponding to the beam 910 vary along the beam length 918 based on a predetermined pattern; so that a heating of the beam 910 causes a beam buckling and the beam mid-point 919 to translate in a predetermined direction 948 generally normal to and outward from the second side 912.

As shown in FIG. 43, in one embodiment, the predetermined pattern is characterized in that, along the beam length 918 from the first support 906 to the beam mid-point 919, beam segment average widths 925, 931, 926 corresponding to successive beam segments 920, 921, 922 do not decrease and at least sometimes increase, and along the beam length 918 from the beam mid-point 919 to the second support 908, beam segment average widths 926, 933, 927 corresponding to successive beam segments 922, 923, 924 do not increase and at least sometimes decrease.

Still referring to FIG. 43, it will be understood that the predetermined pattern of beam segment average widths 925, 931, 926, 933, 927 depicted therein corresponds to a first beam moment 956 and a second beam moment 958, as shown.

In one embodiment, the heating of the beam 910 is provided by an included heater layer 928 disposed on the surface 904, the heater layer coupled to a heater layer input 938 and a heater layer output 940.

In another embodiment, the heating of the beam 910 is provided by a beam heater current 946 supplied by an included beam input 942 and beam output 944.

In one embodiment, the beam is fabricated of a low-conductivity material of either monocrystalline silicon or polycrystalline silicon.

In another embodiment, the beam is fabricated in a device layer of a silicon-on-insulator wafer.

As shown in FIG. 43, in one embodiment, the beam 910 comprises exactly five (5) beam segments 920, 921, 922, 923, 924.

In another embodiment, the beam 910 comprises a plurality (n) of beam segments, where n does not equal 5. In this embodiment, for example, n equals 2, 3, 4, 6, 12, 15, 32, 82, 109, 188, 519, 1003, etc.

As shown, in one embodiment, the beam 910 comprises exactly three (3) beam segments 920, 922, 924 having substantially parallel sides.

As shown, in one embodiment, the beam 910 comprises exactly two (2) beam segments 920, 924 that are substantially equal with respect to their corresponding beam segment lengths and beam segment widths 925, 927.

FIGS. 49–54 depict the thermal actuator 1000 in greater detail.

Figure 49:
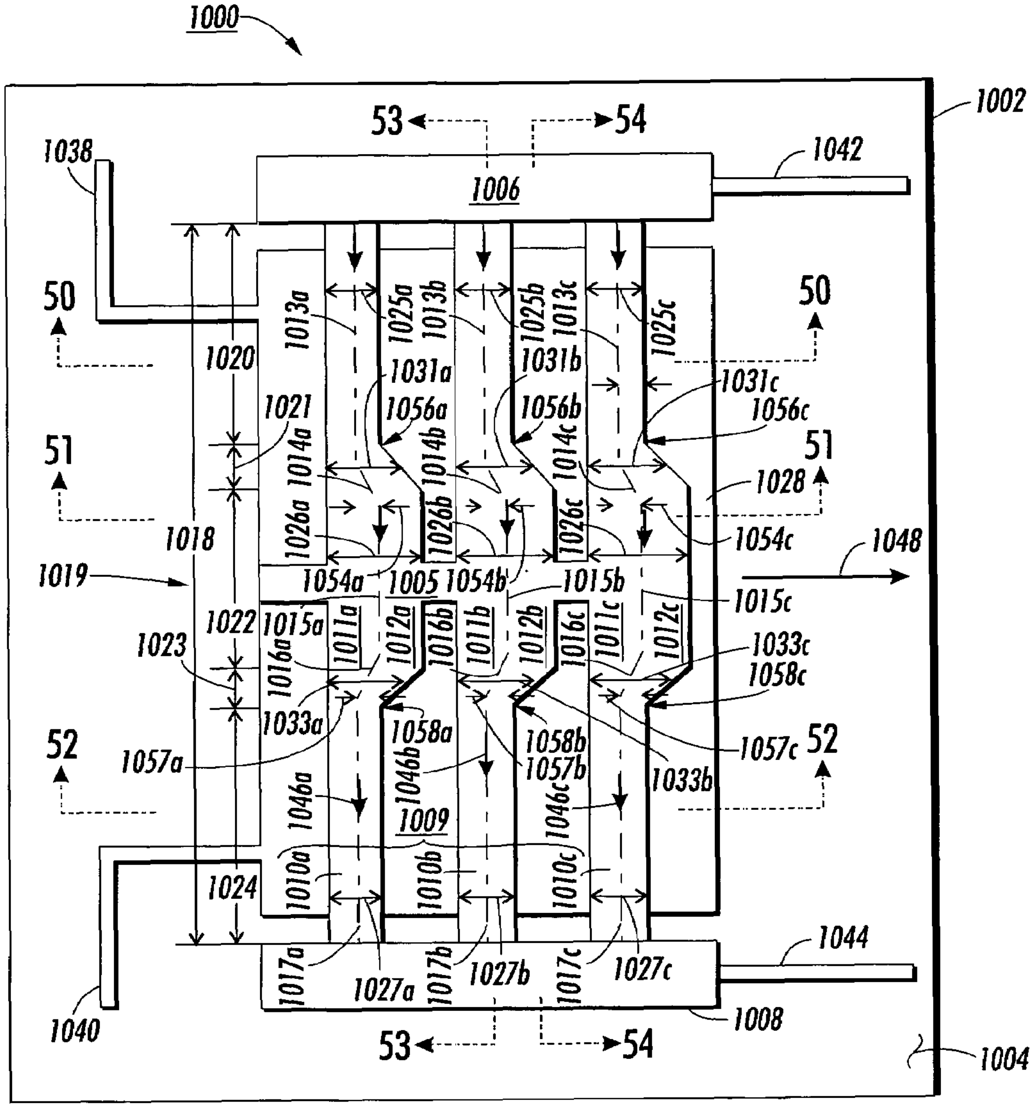
FIG. 49 is an elevated top-down "birds-eye" view of the ninth embodiment 1000 of the thermal actuator 1000, including reference lines 50–54.
Figure 50:
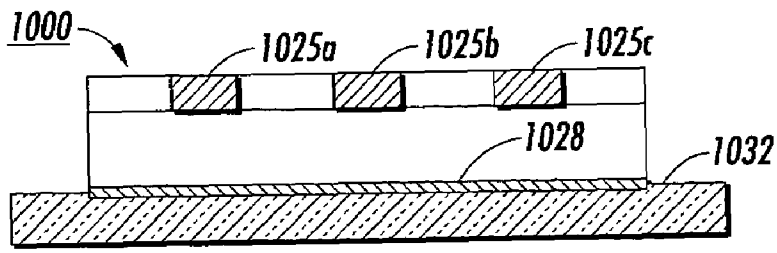
FIG. 50 is a "cut-away" side or profile view of the thermal actuator 1000 along the reference line 50.
Figure 51:
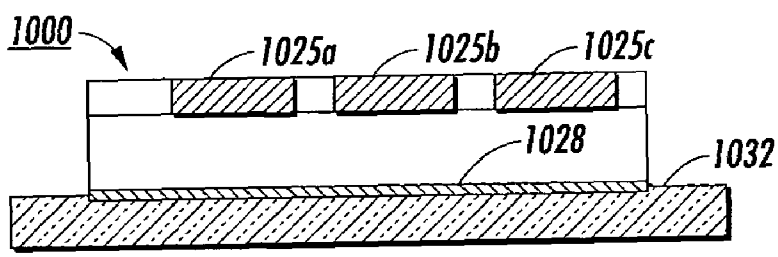
FIG. 51 is a "cut-away" side or profile view of the thermal actuator 1000 along the reference line 51.
Figure 52:
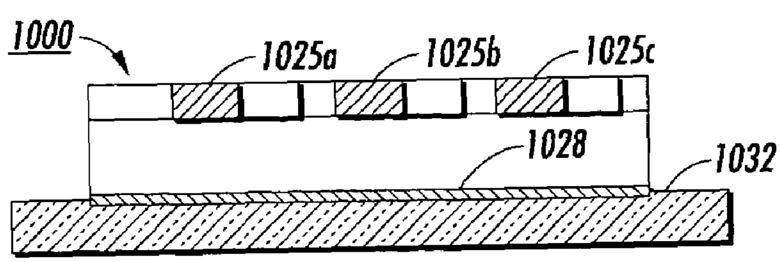
FIG. 52 is a "cut-away" side or profile view of the thermal actuator 1000 along the reference line 52.
Figure 53:
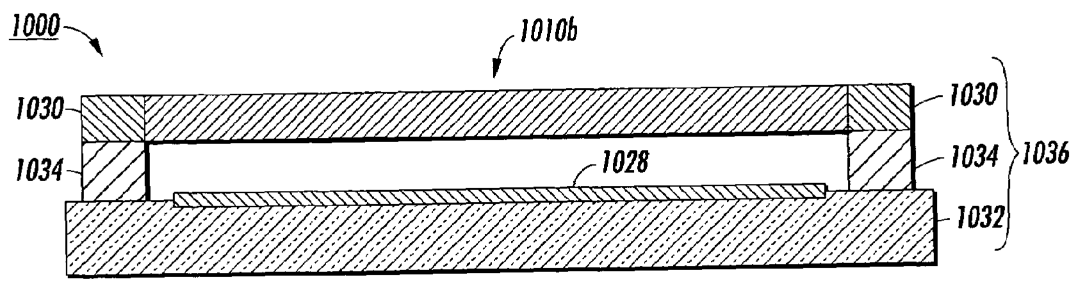
FIG. 53 is a "cut-away" side or profile view of the thermal actuator 1000 along the reference line 53.
Figure 54:
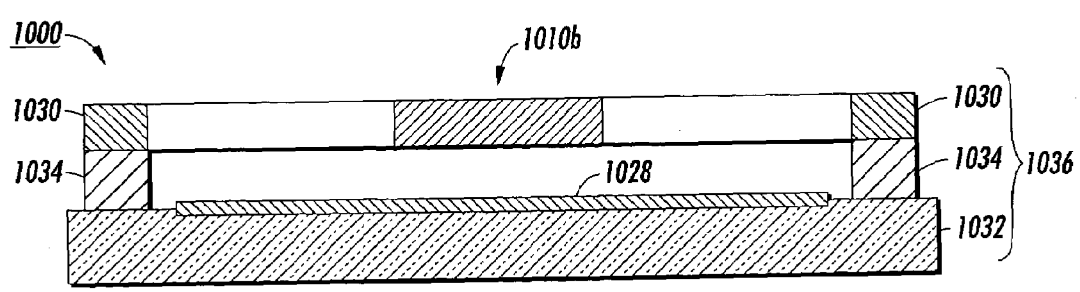
FIG. 54 is a "cut-away" side or profile view of the thermal actuator 1000 along the reference line 54.

Referring now to FIG. 49, there is shown an elevated top-down "birds-eye" view of the thermal actuator 1000, including five (5) reference lines numbered 50–54.

As shown in FIGS. 49–54, the thermal actuator 1000 comprises a substrate 1002 having a surface 1004; a first support 1006 and a second support 1008 disposed on the surface 1004 and extending orthogonally therefrom; a plurality of beams 1010*a*, 1010*b*, 1010*c* extending in parallel between the first support 1006 and the second support 1008, thus forming a beam array 1009; each beam 1010*a*, 1010*b*, 1010*c* of the beam array 1009 having a first side 1011*a*, 1011*b*, 1011*c*, a second side 1012*a*, 1012*b*, 1012*c*, a beam length 1018 and a beam mid-point 1019, each beam being substantially straight along its first side 1011*a*, 1011*b*, 1011*c*; each beam 1010*a*, 1010*b*, 1010*c* of the beam array 1009 comprised of a plurality of beam segments 1020, 1021, 1022, 1023, 1024, each beam segment of the plurality of beam segments having a beam segment average width 1025*a*, 1031*a*, 1026*a*, 1033*a*, 1027*a*; 1025*b*, 1031*b*, 1026*b*, 1033*b*, 1027*b*; 1025*c*, 1031*c*, 1026*c*, 1033*c*, 1027*c* orthogonal to the beam length 1018, each beam thus forming a corresponding plurality of beam segment average widths; wherein the plurality of beam segment average widths 1025*a*, 1031*a*, 1026*a*, 1033*a*, 1027*a*; 1025*b*, 1031*b*, 1026*b*, 1033*b*, 1027*b*; 1025*c*, 1031*c*, 1026*c*, 1033*c*, 1027*c* corresponding to each beam 1010*a*, 1010*b*, 1010*c* vary along the beam length 1018 based on a predetermined pattern; an included coupling beam 1005 extending orthogonally across the beam array 1009 to couple each beam 1010*a*, 1010*b*, 1010*c* of the beam array 1009 substantially at the corresponding beam mid-point 1019; so that a heating of the beam array causes a beam array buckling and the coupling beam 1014 to translate in a predetermined direction 1048 generally normal to and outward from the second sides 1012*a*, 1012*b*, 1012*c* of the array beams 1010*a*, 1010*b*, 1010*c*.

As shown in FIG. 49, in one embodiment, the predetermined pattern is characterized in that, along the beam length 1018 from the first support 1006 to the beam mid-point 1019, beam segment average widths 1025*a*, 1031*a*, 1026*a*; 1025*b*, 1031*b*, 1026*b*; 1025*c*, 1031*c*, 1026*c* corresponding to successive beam segments 1020, 1021, 1022 do not decrease and at least sometimes increase, and along the beam length 1018 from the beam mid-point 1019 to the second support 1008, beam segment widths 1026*a*, 1033*a*, 1027*a*; 1026*b*, 1033*b*, 1027*b*; 1026*c*, 1033*c*, 1027*c* corresponding to successive beam segments 1022, 1023, 1024 do not increase and at least sometimes decrease.

Still referring to FIG. 49, it will be understood that the predetermined pattern of beam segment average widths 1025*a*, 1031*a*, 1026*a*, 1033*a*, 1027*a*; 1025*b*, 1031*b*, 1026*b*, 1033*b*, 1027*b*; 1025*c*, 1031*c*, 1026*c*, 1033*c*, 1027*c* depicted therein corresponds to a plurality of first beam moments 1056*a*, 1056*b*, 1056*c* and second beam moments 1058*a*, 1058*b*, 1058*c*, as shown.

In one embodiment, the heating of the beam array 1009 is provided by an included heater layer 1028 disposed on the surface 1004, the heater layer coupled to a heater layer input 1038 and a heater layer output 1040.

In another embodiment, each beam of the beam array 1009 is heated by a beam heater current 1046*a*, 1046*b*, 1046*c* supplied by an included beam input 1042 and beam output 1044, thus forming the heating of the beam array.

In one embodiment, each beam of the beam array is fabricated of a low-conductivity material of either monocrystalline silicon or polycrystalline silicon.

In another embodiment, each beam of the beam array is fabricated in a device layer of a silicon-on-insulator wafer.

As shown in FIG. 49, in one embodiment, beam 1010*a*, 1010*b*, 1010*c* of the beam array 1009 comprises exactly five (5) beam segments 1020, 1021, 1022, 1023, 1024.

In another embodiment, each beam of the beam array 1009 comprises a plurality (n) of beam segments, where n does not equal 5. In this embodiment, for example, n equals 2, 3, 4, 6, 12, 15, 32, 82, 109, 188, 519, 1003, etc.

As shown in FIG. 49, in one embodiment, the beam array 1009 comprises exactly three (3) beams.

In another embodiment, the beam array 1009 comprises a plurality (n) of beams, where n does not equal 3. In this embodiment, for example, n equals 2, 4, 5, 12, 15, 32, 82, 109, 188, 519, 1003, etc.

The table below lists the drawing element reference numbers together with their corresponding written description:

| Number: | Description: |
|---|---|
| 100a | optical waveguide switch comprising the thermal actuator 200 |
| 100b | optical waveguide switch comprising the thermal actuator 300 |
| 100c | optical waveguide switch comprising the thermal actuator 400 |
| 100d | optical waveguide switch comprising the thermal actuator 500 |
| 100e | optical waveguide switch comprising the thermal actuator 600 |
| 100f | optical waveguide switch comprising the thermal actuator 700 |
| 100g | optical waveguide switch comprising the thermal actuator 800 |
| 100h | optical waveguide switch comprising the thermal actuator 900 |
| 100i | optical waveguide switch comprising the thermal actuator 1000 |
| 200 | first embodiment of a thermal actuator |
| 202 | substrate |
| 204 | surface of the substrate 202 |
| 206 | first support |
| 208 | second support |
| 210 | support spacing |
| 212a–212d | plurality of beams |
| 214 | beam array |
| 216 | first beam of the beam array 214 |
| 218 | last beam of the beam array 214 |
| 220 | coupling beam |
| 222 | pair of adjacent beams in the beam array 214 |
| 224 | beam spacing |
| 226 | beam width |
| 228 | heater layer |
| 230 | device layer |
| 232 | silicon-on-insulator wafer |
| 234 | buried oxide layer |
| 236 | beam temperature |
| 238 | heater layer input |
| 240 | heater layer output |
| 242 | beam input |
| 244 | beam output |
| 246 | beam heater current |
| 248 | predetermined direction |
| 250 | one side of the beam array 214 |
| 252 | opposite side of the beam array 214 |
| 254 | beam heating parameter |
| 256 | beam temperature distribution of the beam array 214 |
| 300 | second embodiment of a thermal actuator |
| 302 | substrate |
| 304 | surface of the substrate 302 |
| 306 | first support |
| 308 | second support |
| 310 | support spacing |
| 312a–312e | plurality of beams |
| 314 | beam array |
| 316 | first beam of the beam array 314 |
| 318 | last beam of the beam array 314 |
| 320 | coupling beam |
| 322 | pair of adjacent beams in the beam array 314 |
| 324 | beam spacing |
| 326 | beam width |
| 328 | heater layer |
| 330 | device layer |
| 332 | silicon-on-insulator wafer |
| 334 | buried oxide layer |
| 336 | beam resistance |
| 338 | heater layer input |
| 340 | heater layer output |
| 342 | beam input |
| 344 | beam output |
| 346 | beam heater current |
| 348 | predetermined direction |
| 350 | one side of the beam array 314 |
| 352 | opposite side of the beam array 314 |
| 354 | beam heating parameter |
| 400 | third embodiment of a thermal actuator |

-continued

| Number: | Description: |
|---|---|
| 402 | substrate |
| 404 | surface of the substrate 402 |
| 406 | first support |
| 408 | second support |
| 410 | support spacing |
| 412a–412e | plurality of beams |
| 414 | beam array |
| 416 | first beam of the beam array 414 |
| 418 | last beam of the beam array 414 |
| 420 | coupling beam |
| 422 | pair of adjacent beams in the beam array 414 |
| 424 | beam spacing |
| 426 | beam width |
| 428 | heater layer |
| 430 | device layer |
| 432 | silicon-on-insulator wafer |
| 434 | buried oxide layer |
| 436 | beam resistance |
| 438 | heater layer input |
| 440 | heater layer output |
| 442 | beam input |
| 444 | beam output |
| 446 | beam heater current |
| 448 | predetermined direction |
| 450 | one side of the beam array 414 |
| 452 | opposite side of the beam array 414 |
| 454 | beam heating parameter |
| 500 | fourth embodiment of a thermal actuator |
| 502 | substrate |
| 504 | surface |
| 506 | first support |
| 508 | second support |
| 510 | beam |
| 511 | first beam side |
| 512 | second beam side |
| 515 | first beam segment neutral axis |
| 516 | second beam segment neutral axis |
| 517 | third beam segment neutral axis |
| 518 | beam length |
| 519 | beam mid-point |
| 520 | first beam segment |
| 522 | second beam segment |
| 524 | third beam segment |
| 525 | first beam segment width |
| 526 | second beam segment width |
| 527 | third beam segment width |
| 528 | heater layer |
| 530 | device layer |
| 532 | handle wafer |
| 534 | buried oxide layer |
| 538 | substrate heater electrical input |
| 540 | substrate heater electrical output |
| 542 | beam heater electrical input |
| 544 | beam heater electrical output |
| 546 | beam heater current |
| 548 | predetermined direction |
| 554 | offset between first beam segment neutral axis 515 and second beam segment neutral axis 516 |
| 556 | first beam moment |
| 557 | offset between second beam segment neutral axis 516 and third beam segment neutral axis 517 |
| 558 | second beam moment |
| 600 | fifth embodiment of a thermal actuator |
| 602 | substrate |
| 604 | surface |
| 606 | first support |
| 608 | second support |
| 610a–610c | plurality of beams |
| 611a–611c | first beam side |
| 612a–612c | second beam side |
| 613 | beam array |
| 614 | coupling beam |
| 615a–615c | first beam segment neutral axis |
| 616a–616c | second beam segment neutral axis |
| 617a–617c | third beam segment neutral axis |
| 618 | beam length |
| 619 | beam mid-point |

-continued

| Number: | Description: |
|---|---|
| 620 | first beam segment |
| 622 | second beam segment |
| 624 | third beam segment |
| 625a–625c | first beam segment width |
| 626a–626c | second beam segment width |
| 627a–627c | third beam segment width |
| 628 | heater layer |
| 630 | device layer |
| 632 | handle wafer |
| 634 | buried oxide layer |
| 638 | substrate heater electrical input |
| 640 | substrate heater electrical output |
| 642 | beam heater electrical input |
| 644 | beam heater electrical output |
| 646a–646c | beam heater current |
| 648 | predetermined direction |
| 654a–654c | offset between first beam segment neutral axis 615a–615c and second beam segment neutral axis 616a–616c |
| 656a–656c | first beam moment |
| 657a–657c | offset between second beam segment neutral axis 616a–616c and third beam segment neutral axis 617a–617c |
| 658a–658c | second beam moment |
| 700 | sixth embodiment of a thermal actuator |
| 702 | substrate |
| 704 | surface |
| 706 | first support |
| 708 | second support |
| 710 | beam |
| 711 | first beam side |
| 712 | second beam side |
| 715 | first beam segment neutral axis |
| 716 | second beam segment neutral axis |
| 717 | third beam segment neutral axis |
| 718 | beam length |
| 719 | beam mid-point |
| 720 | first beam segment |
| 722 | second beam segment |
| 724 | third beam segment |
| 725 | first beam segment width |
| 726 | second beam segment width |
| 727 | third beam segment width |
| 728 | heater layer |
| 730 | device layer |
| 732 | handle wafer |
| 734 | buried oxide layer |
| 738 | substrate heater electrical input |
| 740 | substrate heater electrical output |
| 742 | beam heater electrical input |
| 744 | beam heater electrical output |
| 746 | beam heater current |
| 748 | predetermined direction |
| 754 | offset between first beam segment neutral axis 715 and second beam segment neutral axis 716 |
| 756 | first beam moment |
| 757 | offset between second beam segment neutral axis 716 and third beam segment neutral axis 717 |
| 758 | second beam moment |
| 800 | seventh embodiment of a thermal actuator |
| 802 | substrate |
| 804 | surface |
| 806 | first support |
| 808 | second support |
| 810a–810c | plurality of beams |
| 811a–811c | first beam side |
| 812a–812c | second beam side |
| 813 | beam array |
| 814 | coupling beam |
| 815a–815c | first beam segment neutral axis |
| 816a–816c | second beam segment neutral axis |
| 817a–817c | third beam segment neutral axis |
| 818 | beam length |
| 819 | beam mid-point |
| 820 | first beam segment |
| 822 | second beam segment |
| 824 | third beam segment |
| 825a–825c | first beam segment width |
| 826a–826c | second beam segment width |

-continued

| Number: | Description: |
|---|---|
| 827a–827c | third beam segment width |
| 828 | heater layer |
| 830 | device layer |
| 832 | handle wafer |
| 834 | buried oxide layer |
| 838 | substrate heater electrical input |
| 840 | substrate heater electrical output |
| 842 | beam heater electrical input |
| 844 | beam heater electrical output |
| 846a–846c | beam heater current |
| 848 | predetermined direction |
| 854a–854c | offset between first beam segment neutral axis 815a–815c and second beam segment neutral axis 816a–816c |
| 856a–856c | first beam moment |
| 857a–857c | offset between second beam segment neutral axis 816a–816c and third beam segment neutral axis 817a–817c |
| 858a–858c | second beam moment |
| 900 | eighth embodiment of a thermal actuator |
| 902 | substrate |
| 904 | surface |
| 906 | first support |
| 908 | second support |
| 910 | beam |
| 911 | first beam side |
| 912 | second beam side |
| 913 | first beam segment neutral axis |
| 914 | second beam segment neutral axis |
| 915 | third beam segment neutral axis |
| 916 | fourth beam segment neutral axis |
| 917 | fifth beam segment neutral axis |
| 918 | beam length |
| 919 | beam mid-point |
| 920 | first beam segment |
| 921 | second beam segment |
| 922 | third beam segment |
| 923 | fourth beam segment |
| 924 | fifth beam segment |
| 925 | first beam segment average width |
| 926 | third beam segment average width |
| 927 | fifth beam segment average width |
| 928 | heater layer |
| 930 | device layer |
| 931 | second beam segment average width |
| 932 | substrate |
| 933 | fourth beam segment average width |
| 934 | buried oxide layer |
| 938 | substrate heater electrical input |
| 940 | substrate heater electrical output |
| 942 | beam heater electrical input |
| 944 | beam heater electrical output |
| 946 | beam heater current |
| 948 | predetermined direction |
| 954 | offset between first beam segment neutral axis 913 and third beam segment neutral axis 915 |
| 956 | first beam moment |
| 957 | offset between third beam segment neutral axis 915 and fifth beam segment neutral axis 917 |
| 958 | second beam moment |
| 1000 | ninth embodiment of a thermal actuator |
| 1002 | substrate |
| 1004 | surface |
| 1005 | coupling beam |
| 1006 | first support |
| 1008 | second support |
| 1009 | beam array |
| 1010a–1010c | plurality of beams |
| 1011a–1011c | first beam side |
| 1012a–1012c | second beam side |
| 1013a–1013c | first beam segment neutral axis |
| 1014a–1014c | second beam segment neutral axis |
| 1015a–1015c | third beam segment neutral axis |
| 1016a–1016c | fourth beam segment neutral axis |
| 1017a–1017c | fifth beam segment neutral axis |
| 1018 | beam length |
| 1019 | beam mid-point |
| 1020 | first beam segment |
| 1021 | second beam segment |

-continued

| Number: | Description: |
|---|---|
| 1022 | third beam segment |
| 1023 | fourth beam segment |
| 1024 | fifth beam segment |
| 1025a–1025c | first beam segment average width |
| 1026a–1026c | third beam segment average width |
| 1027a–1027c | fifth beam segment average width |
| 1028 | heater layer |
| 1030 | device layer |
| 1031a–1031c | second beam segment average width |
| 1032 | substrate |
| 1033a–1033c | fourth beam segment average width |
| 1034 | buried oxide layer |
| 1038 | substrate heater electrical input |
| 1040 | substrate heater electrical output |
| 1042 | beam heater electrical input |
| 1044 | beam heater electrical output |
| 1046a–1046c | beam heater current |
| 1048 | predetermined direction |
| 1054a–1054c | offset between first beam segment neutral axis 1013a–1013c and third beam segment neutral axis 1015a–1015c |
| 1056a–1056c | first beam moment |
| 1057a–1057c | offset between third beam segment neutral axis 1015a–1015c and fifth beam segment neutral axis 1017a–1017c |
| 1058a–1058c | second beam moment |

While various embodiments of a thermal actuator and an optical waveguide switch including the same, in accordance with the present invention, have been described hereinabove, the scope of the invention is defined by the following claims.

What is claimed is:

1. A thermal actuator (500) comprising:

a substrate having a surface;

a first support and a second support disposed on the surface and extending orthogonally therefrom;

a beam (510) extending between the first support and the second support, the beam having a first side (511), a second side (512), a beam length (518) and a beam mid-point (519), the beam being substantially straight along the first side (511);

the beam comprised of a plurality of beam segments (520, 522, 524), each beam segment of the plurality of beam segments having a beam segment width (525, 526, 527) orthogonal to the beam length, the beam thus forming a corresponding plurality of beam segment widths;

wherein the plurality of beam segment widths corresponding to the beam vary along the beam length based on a predetermined pattern;

so that a heating of the beam causes a beam buckling and the beam mid-point to translate in a predetermined direction (548) generally normal to and outward from the second side;

wherein the predetermined pattern is characterized in that, along the beam length from the first support to the beam mid-point, beam segment widths corresponding to successive beam segments do not decrease and at least sometimes increase, and along the beam length from the beam mid-point to the second support, beam segment widths corresponding to successive beam segments do not increase and at least sometimes decrease.

2. The thermal actuator of claim 1, the heating of the beam provided by an included heater layer disposed on the surface, the heater layer coupled to a heater layer input and a heater layer output.

3. The thermal actuator of claim 1, the heating of the beam provided by a beam heater current supplied by an included beam input and beam output.

4. The thermal actuator of claim 1, wherein the beam is fabricated of a low-conductivity material of either monocrystalline silicon or polycrystalline silicon.

5. The thermal actuator of claim 1, wherein the beam is fabricated in a device layer of a silicon-an-insulator wafer.

6. The thermal actuator of claim 1, wherein the beam comprises exactly three (3) beam segments.

7. The thermal actuator of claim 1, wherein the beam comprises a plurality (n) of beam segments, where n does not equal 3.

8. The thermal actuator of claim 1, wherein the beam comprises exclusively beam segments having substantially parallel sides.

9. The thermal actuator of claim 1, wherein the beam comprises exactly two (2) beam segments that are substantially equal with respect to their corresponding beam segment lengths and beam segment widths.

10. A thermal actuator (600) comprising:

a substrate having a surface;

a first support and a second support disposed on the surface and extending orthogonally therefrom;

a plurality of beams (610*a*, 610*b*, 610*c*) extending in parallel between the first support and the second support, thus forming a beam array (613);

each beam of the beam array having a first side (611*a*, 611*b*, 611*c*), a second side (612*a*, 612*b*, 612*c*), a beam length (618) and a beam mid-point (619), each beam being substantially straight along its first side (611*a*, 611*b*, 611*c*);

each beam of the beam array comprised of a plurality of beam segments (620, 622, 624), each beam segment of the plurality of beam segments having a beam segment width (625*a*, 626*a*, 627*a*, 625*b*, 626*b*, 627*b*, 625*c*, 627*c*, 627*c*) orthogonal to the beam length, each beam thus forming a corresponding plurality of beam segment widths;

wherein the plurality of beam segment widths corresponding to each beam vary along the beam length based on a predetermined pattern;

an included coupling beam (614) extending orthogonally across the beam array to couple each beam of the beam array substantially at the corresponding beam mid-point;

so that a heating of the beam array causes a beam array buckling and the coupling beam to translate in a predetermined direction (648) generally normal to and outward from the second sides of the array beams;

wherein the predetermined pattern is characterized in that, along the beam length from the first support to the beam mid-point beam segment widths corresponding to successive beam segments do not decrease and at least sometimes increase, and along the beam length from the beam mid-point to the second support, beam segment widths corresponding to successive beam segments do not increase and at least sometimes decrease.

11. The thermal actuator of claim 10, the heating of the beam array provided by an included heater layer disposed on the surface, the heater layer coupled to a heater layer input and a heater layer output.

12. The thermal actuator of claim 10, wherein each beam of the beam array is heated by a beam heater current supplied by an included beam input and beam output, thus forming the heating of the beam array.

13. The thermal actuator of claim 10, wherein each beam of the beam array is fabricated of a low-conductivity material of either monocrystalline silicon or polycrystalline silicon.

14. The thermal actuator of claim 10, wherein each beam of the beam array is fabricated in a device layer of a silicon-on-insulator wafer.

15. The thermal actuator of claim 10, wherein each beam of the beam array comprises exactly three (3) beam segments.

16. The thermal actuator of claim 10, wherein each beam of the beam array comprises a plurality (n) of beam segments, where n does not equal 3.

17. The thermal actuator of claim 10, wherein the beam array comprises exactly three (3) beams.

18. The thermal actuator of claim 10, wherein the beam array comprises a plurality (n) of beams, where n does not equal 3.

19. The thermal actuator (600) of claim 10, wherein the coupling beam (614) intersects only a portion of one beam segment (622) in each beam of the plurality of beams **(610*a*, 610*b*, 610*c*) comprising the beam array (613)**.

20. The thermal actuator (600) of claim 19, wherein the beam array (613) comprises exactly three (3) beams **(610*a*, 610*b*, 610*c*) and wherein each beam of said three (3) beams comprises exactly three (3) beam segments (620, 622, 624)**.

21. A thermal actuator (700) comprising:

a substrate having a surface; a first support and a second support disposed on the surface and extending orthogonally therefrom;

a beam (710) extending between the first support and the second support, the beam having a first side (711), a second side (712), a beam length (718) and a beam mid-point (719), the beam being substantially straight along the second side (712);

the beam comprised of a plurality of beam segments, each beam segment of the plurality of beam segments having a beam segment width (725, 726, 727) orthogonal to the beam length, the beam thus forming a corresponding plurality of beam segment widths;

wherein the plurality of beam segment widths corresponding to the beam vary along the beam length based on a predetermined pattern;

so that a heating of the beam causes a beam buckling and the beam mid-point to translate in a predetermined direction (748) generally normal to and outward from the second side;

wherein the predetermined pattern is characterized in that, along the beam length from the first support to the beam mid-point, beam segment widths corresponding to successive beam segments do not increase and at least sometimes decrease, and along the beam length from the beam mid-point to the second support, beam segment widths corresponding to successive beam segments do not decrease and at least sometimes increase.

22. The thermal actuator of claim 21, the heating of the beam provided by an included heater layer disposed on the surface, the heater layer coupled to a heater layer input and a heater layer output.

23. The thermal actuator of claim 21, the heating of the beam provided by a beam heater current supplied by an included beam input and beam output.

24. The thermal actuator of claim 21, wherein the beam is fabricated of a low-conductivity material of either monocrystalline silicon or polycrystalline silicon.

25. The thermal actuator of claim 21, wherein the beam is fabricated in a device layer of a silicon-on-insulator wafer.

26. The thermal actuator of claim 21, wherein the beam comprises exactly three (3) beam segments.

27. The thermal actuator of claim 21, wherein the beam comprises a plurality (n) of beam segments, where n does not equal 3.

28. The thermal actuator of claim 21, wherein the beam comprises exclusively beam segments having substantially parallel sides.

29. The thermal actuator of claim 21, wherein the beam comprises exactly two (2) beam segments that are substantially equal with respect to their corresponding beam segment lengths and beam segment widths.

30. A thermal actuator (800) comprising:

a substrate having a surface; a first support and a second support disposed on the surface and extending orthogonally therefrom;

a plurality of beams **(810*a*, (810*b*, 810*c*) extending in parallel between the first support and the second support, thus forming a beam array (813)**;

each beam of the beam array having a first side **(811*a*, 811*b*, 811*c*), a second side (812*a*, 812*b*, 812*c*), a beam length (818) and a beam mid-point (819), each beam being substantially straight along its second side (812*a*, 812*b*, 812*c*)**;

each beam of the beam array comprised of a plurality of beam segments (820, 822, 824), each beam segment of the plurality of beam segments having a beam segment width **(825*a*, 826*a*, 827*a*, 825*b*, 826*b*, 827*b*, 825*c*, 826*c*, 827*c*)** orthogonal to the beam length, each beam thus forming a corresponding plurality of beam segment widths;

wherein the plurality of beam segment widths corresponding to each beam vary along the beam length based on a predetermined pattern;

an included coupling beam (814) extending orthogonally across the beam array to couple each beam of the beam array substantially at the corresponding beam mid-point;

so that a heating of the beam array causes a beam array buckling and the coupling beam to translate in a predetermined direction (848) generally normal to and outward from the second sides of the array beams;

wherein the predetermined pattern is characterized in that, along the beam length from the first support to the beam mid-point, beam segment widths corresponding to successive beam segments do not increase and at least sometimes decrease, and along the beam length from the beam mid-point to the second support, beam segment widths corresponding to successive beam segments do not decrease and at least sometimes increase.

31. The thermal actuator of claim 30, the heating of the beam array provided by an included heater layer disposed on the surface, the heater layer coupled to a heater layer input and a heater layer output.

32. The thermal actuator of claim 30, wherein each beam of the beam array is heated by a beam heater current supplied by an included beam input and beam output, thus forming the heating of the beam array.

33. The thermal actuator of claim 30, wherein each beam of the beam array is fabricated of a low-conductivity material of either monocrystalline silicon or polycrystalline silicon.

34. The thermal actuator of claim 30, wherein each beam of the beam array is fabricated in a device layer of a silicon-on-insulator wafer.

35. The thermal actuator of claim 30, wherein each beam of the beam array comprises exactly three (3) beam segments.

36. The thermal actuator of claim 30, wherein each beam of the beam array comprises a plurality (n) of beam segments, where n does not equal 3.

37. The thermal actuator of claim 30, wherein the beam array comprises exactly three (3) beams.

38. The thermal actuator of claim 30, wherein the beam array 813 comprises a plurality (n) of beams, where n does not equal 3.

39. The thermal actuator (800) of claim 30, wherein the coupling beam (814) intersects only a portion of one beam segment (822) in each beam of the plurality of beams **(810*a*, 810*b*, 810*c*) comprising the beam array (813)**.

40. The thermal actuator (800) of claim 39, wherein the beam array (813) comprises exactly three (3) beams **(810*a*, 810*b*, 810*c*) and wherein each beam of said three (3) beams comprises exactly three (3) beam segments (820, 822, 824)**.

41. A thermal actuator (900) comprising:

a substrate having a surface;

a first support and a second support disposed on the surface and extending orthogonally therefrom;

a beam (910) extending between the first support and the second support, the beam having a first side (911), a second side (912), a beam length (918) and a beam mid-point (919), the beam being substantially straight along the first side (911);

the beam comprised of a plurality of beam segments (920, 921, 922, 923, 924), each beam segment of the plurality of beam segments having a beam segment average width (925, 931, 926, 933, 927) orthogonal to the beam length, the beam thus forming a corresponding plurality of beam segment average widths;

wherein the plurality of beam segment average widths corresponding to the beam vary along the beam length based on a predetermined pattern;

so that a heating of the beam causes a beam buckling and the beam mid-point to translate in a predetermined direction (948) generally normal to and outward from the second side;

wherein the predetermined pattern is characterized in that, along the beam length from the first support to the beam mid-point, beam segment average widths corresponding to successive beam segments do not decrease and at least sometimes increase, and along the beam length from the beam mid-point to the second support, beam segment average widths corresponding to successive beam segments do not increase and at least sometimes decrease.

42. The thermal actuator of claim 41, the heating of the beam provided by an included heater layer disposed on the surface, the heater layer coupled to a heater layer input and a heater layer output.

43. The thermal actuator of claim 41, the heating of the beam provided by a beam heater current supplied by an included beam input and beam output.

44. The thermal actuator of claim 41, wherein the beam is fabricated of a low-conductivity material of either monocrystalline silicon or polycrystalline silicon.

45. The thermal actuator of claim 41, wherein the beam is fabricated in a device layer of a silicon-on-insulator wafer.

46. The thermal actuator of claim 41, wherein the beam comprises exactly five (5) beam segments.

47. The thermal actuator of claim 41, wherein the beam comprises a plurality (n) of beam segments, where n does not equal 5.

48. The thermal actuator of claim 41, wherein the beam comprises exactly three (3) beam segments having substantially parallel sides.

49. The thermal actuator of claim 41, wherein the beam comprises exactly two (2) beam segments that are substantially equal with respect to their corresponding beam segment lengths and beam segment widths.

50. A thermal actuator (1000) comprising:

a substrate having a surface;

a first support and a second support disposed on the surface and extending orthogonally therefrom;

a plurality of beams **(1010*a*, 1010*b*, 1010*c*), extending in parallel between the first support and the second support, thus forming a beam array (1009)**;

each beam of the beam array having a first side **(1011*a*, 1011*b*, 1011*c*), a second side (1012*a*, 1012*b*, 1012*c*), a beam length (1018) and a beam mid-point (1019), each beam being substantially straight along its first side (1011*a*, 1011*b*, 1011*c*)**;

each beam of the beam array comprised of a plurality of beam segments (1020, 1021, 1022, 1023, 1024), each beam segment of the plurality of beam segments having a beam segment average width **(1025*a*, 1031*a*, 1026*a*, 1033*a*, 1027*a*, 1025*b*, 1031*b*, 1026*b*, 1033*b*, 1027*b*, 1025*c*, 1031*c*, 1026*c*, 1033*c*, 1027*c*)** orthogonal to the beam length, each beam thus forming a corresponding plurality of beam segment average widths;

wherein the plurality of beam segment average widths corresponding to each beam vary along the beam length based on a predetermined pattern;

an included coupling beam (1005) extending orthogonally across the beam array to couple each beam of the beam array substantially at the corresponding beam mid-point;

so that a heating of the beam array causes a beam array buckling and the coupling beam to translate in a predetermined direction (1048) generally normal to and outward from the second sides of the array beams;

wherein the predetermined pattern is characterized in that, along the beam length from the first support to the beam mid-point, beam segment average widths corresponding to successive beam segments do not decrease and at least sometimes increase, and along the beam length from the beam mid-point to the second support, beam segment widths corresponding to successive beam segments do not increase and at least sometimes decrease.

51. The thermal actuator of claim 50, the heating of the beam array provided by an included heater layer disposed on the surface, the heater layer coupled to a heater layer input and a heater layer output.

52. The thermal actuator of claim 50, wherein each beam of the beam array is heated by a beam heater current by an included beam input and beam output, thus forming the heating of the beam array.

53. The thermal actuator of claim 50, wherein each beam of the beam array is fabricated of a low-conductivity material of either monocrystalline silicon or polycrystalline silicon.

54. The thermal actuator of claim 50, wherein each beam of the beam array is fabricated in a device layer of a silicon-on-insulator wafer.

55. The thermal actuator of claim 50, wherein each beam of the beam array comprises exactly five (5) beam segments.

56. The thermal actuator of claim 50, wherein each beam of the beam array comprises a plurality (n) of beam segments, where n does not equal 5.

57. The thermal actuator of claim 50, wherein the beam array comprises exactly three (3) beams.

58. The thermal actuator of claim 50, wherein the beam array comprises a plurality (n) of beams, where n does not equal 3.

59. The thermal actuator (1000) of claim 50, wherein the coupling beam (1005) intersects only a portion of one beam segment (1022) in each beam of the plurality of beams **(1010*a*, 1010*b*, 1010*c*) comprising the beam array (1009)**.

60. The thermal actuator (1000) of claim 59, wherein the beam array (1009) comprises exactly three (3) beams **(1010*a*, 1010*b*, 1010*c*) and wherein each beam of said three (3) beams comprises exactly five (5) beam segments (1020, 1021, 1022, 1023, 1024)**.

61. An optical waveguide switch **(100*d*) comprising a thermal actuator (500)**, the thermal actuator comprising:

a substrate having a surface;

a first support and a second support disposed on the surface and extending orthogonally therefrom;

a beam (510) extending between the first support and the second support, the beam having a first side (511), a second side (512), a beam length (518) and a beam mid-point (519), the beam being substantially straight along the first side (511);

the beam comprised of a plurality of beam segments (520, 522, 524), each beam segment of the plurality of beam segments having a beam segment width (525, 526, 527) orthogonal to the beam length, the beam thus forming a corresponding plurality of beam segment widths;

wherein the plurality of beam segment widths corresponding to the beam vary along the beam length based on a predetermined pattern;

so that a heating of the beam causes a beam buckling and the beam mid-point to translate in a predetermined direction (548) generally normal to and outward from the second side;

wherein the predetermined pattern is characterized in that, along the beam length from the first support to the beam mid-point, beam segment widths corresponding to successive beam segments do not decrease and at least sometimes increase, and along the beam length from the beam mid-point to the second support, beam segment widths corresponding to successive beam segments do not increase and at least sometimes decrease.

62. The optical waveguide switch of claim 61, the heating of the beam provided by an included heater layer disposed on the surface, the heater layer coupled to a heater layer input and a heater layer output.

63. The optical waveguide switch of claim 61, the heating of the beam provided by a beam heater current supplied by an included beam input and beam output.

64. The optical waveguide switch of claim 61, wherein the beam is fabricated of a low-conductivity material of either monocrystalline silicon or polycrystalline silicon.

65. The optical waveguide switch of claim 61, wherein the beam is fabricated in a device layer of a silicon-on-insulator wafer.

66. The optical waveguide switch of claim 61, wherein the beam comprises a plurality (n) of beam segments, where n does not equal 3.

67. The optical waveguide switch of claim 61, wherein the beam comprises exactly three (3) beam segments.

68. The optical waveguide switch of claim 61, wherein the beam comprises exclusively beam segments having substantially parallel sides.

69. The optical waveguide switch of claim 61, wherein the beam comprises exactly two (2) beam segments that are substantially equal with respect to their corresponding beam segment lengths and beam segment widths.

70. An optical waveguide switch **(100*e*) comprising a thermal actuator (600)**, the thermal actuator comprising:

a substrate having a surface;

a first support and a second support disposed on the surface and extending orthogonally therefrom;

a plurality of beams **(610*a*, 610*b*, 610*c*) extending in parallel between the first support and the second support, thus forming a beam array (613)**;

each beam of the beam array having a first side **(611 a, 611*b*, 611*c*), a second side (612*a*, 612*b*, 612*c*), a beam length (618) and a beam mid-point (619), each beam being substantially straight along its first side (611*a*, 611*b*, 611*c*)**;

each beam of the beam array comprised of a plurality of beam segments (620, 622, 624), each beam segment of the plurality of beam segments having a beam segment width **(625*a*, 626*a*, 627*a*, 625*b*, 626*b*, 627*b*, 625*c*, 626*c*, 627*c*)** orthogonal to the beam length, each beam thus forming a corresponding plurality of beam segment widths;

wherein the plurality of beam segment widths corresponding to each beam vary along the beam length based on a predetermined pattern;

an included coupling beam (614) extending orthogonally across the beam array to couple each beam of the beam array substantially at the corresponding beam mid-point;

so that a heating of the beam array causes a beam array buckling and the coupling beam to translate in a predetermined direction (648) generally normal to and outward from the second sides of the array beams;

wherein the predetermined pattern is characterized in that, along the beam length from the first support to the beam mid-point, beam segment widths corresponding to successive beam segments do not decrease and at least sometimes increase, and along the beam length from the beam mid-point to the second support, beam segment widths corresponding to successive beam segments do not increase and at least sometimes decrease.

71. The optical waveguide switch of claim 70, the heating of the beam array provided by an included heater layer disposed on the surface, the heater layer coupled to a heater layer input and a heater layer output.

72. The optical waveguide switch of claim 70, wherein each beam of the beam array is heated by a beam heater current supplied by an included beam input and beam output, thus forming the heating of the beam array.

73. The optical waveguide switch of claim 70, wherein each beam of the beam array is fabricated of a low-conductivity maternal of either monocrystalline silicon or polycrystalline silicon.

74. The optical waveguide switch of claim 70, wherein each beam of the beam array is fabricated in a device layer of a silicon-on-insulator wafer.

75. The optical waveguide switch of claim 70, wherein each beam of the beam array comprises a plurality (n) of beam segments, where n does not equal 3.

76. The optical waveguide switch of claim 70, wherein each beam of the beam array comprises exactly three (3) beam segments.

77. The optical waveguide switch of claim 70, wherein the beam array comprises a plurality (n) of beams, where n does not equal 3.

78. The optical waveguide switch claim 70, wherein the beam array comprises exactly three (3) beams.

79. The optical waveguide switch **(100*e*) of claim 70, wherein the coupling beam (614) intersects only a portion of one beam segment (622) in each beam of the plurality of beams (610***a*, 610*b*, 610*c*) comprising the beam array (613).

80. The optical waveguide switch (100*e*) of claim 79, wherein the beam array (613) comprises exactly three (3) beams (610*a*, 610*b*, 610*c*) and wherein each beam of said three (3) beams comprises exactly three (3) beam segments (620, 622, 624).

81. An optical waveguide switch (100*f*) comprising a thermal actuator (700), the thermal actuator comprising:

a substrate having a surface;

a first support and a second support disposed on the surface and extending orthogonally therefrom;

a beam (710) extending between the first support and the second support, the beam having a first side (711), a second side (712), a beam length (718) and a beam mid-point (719), the beam being substantially straight along the second side (712);

the beam comprised of a plurality of beam segments, each beam segment of the plurality of beam segments having a beam segment width (725, 726, 727) orthogonal to the beam length, the beam thus forming a corresponding plurality of beam segment widths;

wherein the plurality of beam segment widths corresponding to the beam vary along the beam length based on a predetermined pattern;

so that a heating of the beam causes a beam buckling and the beam mid-point to translate in a predetermined direction (748) generally normal to and outward from the second sides;

wherein the predetermined pattern is characterized in that, along the beam length from the first support to the beam mid-point, beam segment widths corresponding to successive beam segments do not increase and at least sometimes decrease, and along the beam length from the beam mid-point to the second support, beam segment widths corresponding to successive beam segments do not decrease and at least sometimes increase.

82. The optical waveguide switch of claim 81, the heating of the beam provided by an included heater layer disposed on the surface, the heater layer coupled to a heater layer input and a heater layer output.

83. The optical waveguide switch of claim 81, the heating of the beam provided by a beam heater current supplied by an included beam input and beam output.

84. The optical waveguide switch of claim 81, wherein the beam is fabricated of a low-conductivity material of either monocrystalline silicon or polycrystalline silicon.

85. The optical waveguide switch of claim 81, wherein the beam is fabricated in a device layer of a silicon-on-insulator wafer.

86. The optical waveguide switch of claim 81, wherein the beam comprises a plurality (n) of beam segments, where n does not equal 3.

87. The optical waveguide switch of claim 81, wherein the beam comprises exactly three (3) beam segments.

88. The optical waveguide switch of claim 81, wherein the beam comprises exclusively beam segments having substantially parallel sides.

89. The thermal actuator of claim 81, wherein the beam comprises exactly two (2) beam segments that are substantially equal with respect to their corresponding beam segment lengths and beam segment widths.

90. An optical waveguide switch (100*g*) comprising a thermal actuator (800), the thermal actuator comprising:

a substrate having a surface;

a first support and a second support disposed on the surface and extending orthogonally therefrom;

a plurality of beams (810*a*, 810*b*, 810*c*) extending in parallel between the first support and the second support, thus forming a beam array (813); each beam of the beam array having a first side (811*a*, 811*b*, 811*c*), a second side (812*a*, 812*b*, 812*c*), a beam length (818) and a beam mid-point (819), each beam being substantially straight along its second side (812*a*, 812*b*, 812*c*); each beam of the beam array comprised of a plurality of beam segments (820, 822, 824), each beam segment of the plurality of beam segments having a beam segment width (825*a*, 826*a*, 827*a*, 825*b*, 826*b*, 827*b*, 825*c*, 826*c*, 827*c*) orthogonal to the beam length, each beam thus forming a corresponding plurality of beam segment widths;

wherein the plurality of beam segment widths corresponding to each beam vary along the beam length based on a predetermined pattern;

an included coupling beam (814) extending orthogonally across the beam array to couple each beam of the beam array substantially at the corresponding beam mid-point;

so that a heating of the beam array causes a beam array buckling and the coupling beam to translate in a predetermined direction (848) generally normal to and outward from the second sides of the array beams;

wherein the predetermined pattern is characterized in that, along the beam length from the first support to the beam mid-point, beam segment widths corresponding to successive beam segments do not increase and at least sometimes decrease, and along the beam length from the beam mid-point to the second support beam segment widths corresponding to successive beam segments do not decrease and at least sometimes increase.

91. The optical waveguide switch of claim 90, the heating of the beam array provided by an included heater layer disposed on the surface, the heater layer coupled to a heater layer input and a heater layer output.

92. The optical waveguide switch of claim 90, wherein each beam of the beam array is heated by a beam heater current supplied by an included beam input and beam output, thus forming the heating of the beam array.

93. The optical waveguide switch of claim 90, wherein each beam of the beam array is fabricated of a low-conductivity material of either monocrystalline silicon or polycrystalline silicon.

94. The optical waveguide switch of claim 90, wherein each beam of the beam array is fabricated in a device layer of a silicon-on-insulator wafer.

95. The optical waveguide switch of claim 90, wherein each beam of the beam array 813 comprises a plurality (n) of beam segments, where n does not equal 3.

96. The optical waveguide switch of claim 90, wherein each beam of the beam array comprises exactly three (3) beam segments.

97. The optical waveguide switch of claim 90, wherein the beam array comprises a plurality (n) of beams, where n does not equal 3.

98. The optical waveguide switch of claim 90, wherein the beam array comprises exactly three (3) beams.

99. The optical waveguide switch (100*g*) of claim 90, wherein the coupling beam (814) intersects only a portion of one beam segment (822) in each beam of the plurality of beams (810*a*, 810*b*, 810*c*) comprising the beam array (813).

100. The optical waveguide switch (100*g*) of claim 99, wherein the beam array (813) comprises exactly three (3)

beams (810*a*, 810*b*, 810*c*) and wherein each beam of said three (3) beams comprises exactly three (3) beam segments (820, 822, 824).

101. An optical waveguide switch (100*h*) comprising a thermal actuator (900), the thermal actuator comprising:

a substrate having a surface;

a first support and a second support disposed on the surface and extending orthogonally therefrom;

a beam (910) extending between the first support and the second support, the beam having a first side (911), a second side (912), a beam length (918) and a beam mid-point (919), the beam being substantially straight along the first side (911);

the beam comprised of a plurality of beam segments (920, 921, 922, 923, 924), each beam segment of the plurality of beam segments having a beam segment average width (925, 931, 926, 933, 927) orthogonal to the beam length, the beam thus forming a corresponding plurality of beam segment average widths;

wherein the plurality of beam segment average widths corresponding to the beam vary along the beam length based on a predetermined pattern;

so that a heating of the beam causes a beam buckling and the beam mid-point to translate in a predetermined direction (948) generally normal to and outward from the second side;

wherein the predetermined pattern is characterized in that, along the beam length from the first support to the beam mid-point, beam segment average widths corresponding to successive beam segments do not decrease and at least sometimes increase and along the beam length from the beam mid-point to the second support, beam segment average widths corresponding to successive beam segments do not increase and at least sometimes decrease.

102. The optical waveguide switch of claim 101, the heating of the beam provided by an included heater layer disposed on the surface, the heater layer coupled to a heater layer input and a heater layer output.

103. The optical waveguide switch of claim 101, the heating of the beam provided by a beam heater current supplied by an included beam input and beam output.

104. The optical waveguide switch of claim 101, wherein the beam is fabricated of a low-conductivity material of either monocrystalline silicon or polycrystalline silicon.

105. The optical waveguide switch of claim 101, wherein the beam is fabricated in a device layer of a silicon-on-insulator wafer.

106. The optical waveguide switch of claim 101, wherein the beam comprises a plurality (n) of beam segments, where n does not equal 5.

107. The optical waveguide switch of claim 101, wherein the beam comprises exactly five (5) beam segments.

108. The optical waveguide switch of claim 101, wherein the beam comprises exactly three (3) beam segments having substantially parallel sides.

109. The optical waveguide switch of claim 101, wherein the beam comprises exactly two (2) beam segments that are substantially equal with respect to their corresponding beam segment lengths and beam segment widths.

110. An optical waveguide switch (100*i*) comprising a thermal actuator (1000), the thermal actuator comprising:

a substrate having a surface;

a first support and a second support disposed on the surface and extending orthogonally therefrom;

a plurality of beams (1010*a*, 1010*b*, 1010*c*) extending in parallel between the first support and the second support, thus forming a beam array (1009);

each beam of the beam array having a first side (1011*a*, 1011*b*, 1011*c*), a second side (1012*a*, 1012*b*, 1012*c*), a beam length (1018) and a beam mid-point (1019), each beam being substantially straight along its first side (1011*a*, 1011*b*, 1011*c*);

each beam of the beam array comprised of a plurality of beam segments (1020, 1021, 1022, 1023, 1024), each beam segment of the plurality of beam segments having a beam segment average width (1025*a*, 1031*a*, 1026*a*, 1033*a*, 1025*b*, 1031*b*, 1026*b*, 1033*b*, 1027*b*, 1025*c*, 1031*c*, 1026*c*, 1033*c*, 1027*c*) orthogonal to the beam length, each beam thus forming a corresponding plurality of beam segment average widths;

wherein the plurality of beam segment average widths corresponding to each beam vary along the beam length based on a predetermined pattern;

an included coupling beam (1005) extending orthogonally across the beam arry to couple each beam of the beam array substantially at the corresponding beam mid-point;

so that a heating of the beam array causes a beam array buckling and the coupling beam to translate in a predetermined direction (1048) generally normal to an outward from the second sides of the array beams;

wherein the predetermined pattern is characterized in that, along the beam length from the first support to the beam mid-point, beam segment average widths corresponding to successive beam segments do not decrease and at least sometimes increase, and along the beam length from the beam mid-point to the second support, beam segment widths corresponding to successive beam segments do not increase and at least sometimes decrease.

111. The optical waveguide switch of claim 110, the heating of the beam array provided by an included heater layer disposed on the surface, the heater layer coupled to a heater layer input and a heater layer output.

112. The optical waveguide switch of claim 110, wherein each beam of the beam array is heated by a beam heater current supplied by an included beam input and beam output, thus forming the heating of the beam array.

113. The optical waveguide switch of claim 110, wherein each beam of the beam array is fabricated of a low-conductivity material of either monocrystalline silicon or polycrystalline silicon.

114. The optical waveguide switch of claim 110, wherein each beam of the beam array is fabricated in a device layer of a silicon-on-insulator wafer.

115. The optical waveguide switch of claim 110, wherein each beam of the beam array comprises a plurality (n) of beam segments, where n does not equal 5.

116. The optical waveguide switch of claim 110, wherein each beam of the beam array comprises exactly five (5) beam segments.

117. The optical waveguide switch of claim 110, wherein the beam array comprises a plurality (n) of beams, where n does not equal 3.

118. The optical waveguide switch of claim 110, wherein the beam array comprises exactly three (3) beams.

119. The optical waveguide switch (100*i*) of claim 110, wherein the coupling beam (1005) intersects only a portion of one beam segment (1022) in each beam of the plurality of beams (1010*a*, 1010*b*, 1010*c*) comprising the beam array (1009).

120. The optical waveguide switch (100*i*) of claim 119, wherein the beam array (1009) comprises exactly three (3) beams (1010*a*, 1010*b*, 1010*c*) and wherein each beam of said three (3) beams comprises exactly five (5) beam segments (1020, 1021, 1022, 1023, 1024).

* * * * *